(12) United States Patent
Sikdar et al.

(10) Patent No.: US 11,119,857 B2
(45) Date of Patent: Sep. 14, 2021

(54) SUBSTITUTE REDUNDANT MEMORY

(71) Applicants: Dipak K Sikdar, Santa Clara, CA (US); Rajesh Chopra, San Ramon, CA (US)

(72) Inventors: Dipak K Sikdar, Santa Clara, CA (US); Rajesh Chopra, San Ramon, CA (US)

(73) Assignee: MOSYS, INC., San Jose, CA (US)

( * ) Notice: Subject to any disclaimer, the term of this patent is extended or adjusted under 35 U.S.C. 154(b) by 208 days.

(21) Appl. No.: 14/031,031

(22) Filed: Sep. 18, 2013

(65) Prior Publication Data

US 2014/0082453 A1 Mar. 20, 2014

Related U.S. Application Data

(63) Continuation-in-part of application No. 13/732,783, filed on Jan. 2, 2013, now Pat. No. 9,037,928.
(Continued)

(51) Int. Cl.
*G06F 11/10* (2006.01)
*G11C 29/44* (2006.01)
(Continued)

(52) U.S. Cl.
CPC .......... *G06F 11/108* (2013.01); *G06F 11/106* (2013.01); *G06F 11/2094* (2013.01);
(Continued)

(58) Field of Classification Search
CPC .. G06F 11/108; G06F 11/2094; G06F 11/106; G11C 29/808; G11C 29/50;
(Continued)

(56) References Cited

U.S. PATENT DOCUMENTS 5,452,251 A * 9/1995 Akaogi ................. G11O 5/145
365/185.13
6,011,734 A * 1/2000 Pappert .............. G11C 29/4401
365/195

(Continued)

OTHER PUBLICATIONS

Nadkarni, R.; Arsovski, I.; Wistort, R.; Chickanosky, V., "Improved Match-Line Test and Repair Methodology Including Power-Supply Noise Testing for Content-Addressable Memories," in Test Conference, 2006. ITC '06. IEEE International , vol., No., pp. 1-9, Oct. 2006.*

(Continued)

*Primary Examiner* — Cynthia Britt

(57) ABSTRACT

An integrated circuit (IC) chip for transparent and in-service or production repair of single to multiple memory cell defects in a word during the datapath transit of the word between core memory to the interface of the IC via capturing an accurate bit from a word during a write access to a known defective memory address, and by substituting in a non-defective bit into the word during a read access from a known defective memory address. The IC includes: address matching circuit (CAM), a random access memory (RAM) of substitute memory cells containing accurate associated bit data and bit location in word of defect, and data selection circuitry (MUXs) coupled together.

76 Claims, 9 Drawing Sheets

Related U.S. Application Data

(60) Provisional application No. 61/702,253, filed on Sep. 18, 2012.

(51) Int. Cl.
  *G11C 29/42* (2006.01)
  *G06F 11/20* (2006.01)
  *G11C 29/06* (2006.01)
  *G11C 29/12* (2006.01)
  *G11C 29/50* (2006.01)
  *G11C 29/00* (2006.01)

(52) U.S. Cl.
  CPC .............. *G11C 29/06* (2013.01); *G11C 29/12* (2013.01); *G11C 29/42* (2013.01); *G11C 29/44* (2013.01); *G11C 29/4401* (2013.01); *G11C 29/50* (2013.01); *G11C 29/808* (2013.01)

(58) Field of Classification Search
  CPC ......... G11C 29/42; G11C 29/12; G11C 29/06; G11C 29/4401; G11C 29/44; G11C 29/16; G11C 2029/0409
  USPC .......................................................... 714/710
  See application file for complete search history.

(56) References Cited

U.S. PATENT DOCUMENTS

| | | | | |
|---|---|---|---|---|
| 6,249,467 B1 * | 6/2001 | Pereira | .................... | G11C 15/00 365/200 |
| 6,307,787 B1 * | 10/2001 | Al-Shamma | ........... | G11C 15/00 365/185.33 |
| 6,397,313 B1 * | 5/2002 | Kasa | .................... | G11C 29/781 365/200 |
| 6,504,768 B1 * | 1/2003 | Roohparvar | ......... | G11C 29/846 365/189.05 |
| 6,634,003 B1 * | 10/2003 | Phan | ..................... | G11C 29/76 324/537 |
| 6,845,477 B2 * | 1/2005 | Hidaka | .................. | G11C 29/48 324/757.03 |
| 6,920,525 B2 * | 7/2005 | Chadwick | ............. | G11C 15/00 365/200 |
| 7,283,380 B1 * | 10/2007 | Srinivasan | ............ | G11C 15/04 365/189.07 |
| 7,509,543 B2 * | 3/2009 | Mohr | .................... | G11C 17/18 365/201 |
| 7,627,792 B2 * | 12/2009 | Di Ronza | ............. | G11C 29/72 365/201 |
| 7,739,559 B2 * | 6/2010 | Suzuki | ................... | G11C 29/76 714/710 |
| 7,809,998 B1 * | 10/2010 | Sutardja | ............. | G06F 11/1008 365/201 |
| 7,814,382 B2 * | 10/2010 | Sutardja | ............. | G06F 11/1008 365/201 |
| 7,996,710 B2 * | 8/2011 | Nagaraj | ............. | G06F 12/0246 711/100 |
| 9,037,928 B2 * | 5/2015 | Kleveland | .............. | G11C 29/44 714/710 |
| 2004/0225912 A1 * | 11/2004 | Ronza | .................... | G11C 29/72 714/5.1 |
| 2004/0261049 A1 * | 12/2004 | Mohr | .................... | G11C 17/18 714/710 |
| 2007/0168781 A1 * | 7/2007 | Sutardja | ............. | G06F 11/1008 714/718 |

OTHER PUBLICATIONS

Pourmeidani, H.; Habibi, M., "Hierarchical defect tolerance technique for NRAM repairing with range matching CAM," in Electrical Engineering (ICEE), 2013 21st Iranian Conference on , vol., No., pp. 1-6, May 14-16, 2013.*

* cited by examiner

SUBSTITUTE REDUNDANT MEMORY

RELATED APPLICATIONS

This application claims priority to and benefit of the following U.S. Patent Application Ser. No. 61/702,253, entitled "Shared Memory Redundancy," with filing date Sep. 18, 2012.

This application is also related to and claims priority to the following U.S. patent application Ser. No. 13/732,783, entitled "Memory Device With Background Built-In Self-Testing And Background Built-In Self-Repair," filed Jan. 2, 2013, the contents of which are incorporated herein by reference, and with priority claimed for all commonly disclosed subject matter, which further is a continuation of and claims priority to U.S. patent application Ser. No. 61/582,365, entitled: "Hidden Memory Repair", filed Jan. 1, 2012, which all of said applications are herein incorporated by reference in their entirety.

FIELD OF THE TECHNOLOGY

The present technology relates generally to memory redundancy and memory repair for integrated circuits.

BACKGROUND

Traditional memory devices employ integrated circuits (IC) to create memory such as Random Access Memory (RAM) for use in computing systems. The memory employs a plurality of memory cells to store bits that make up varying lengths of data, such as bytes, words, pages, sectors, etc. A memory cell, or bit, may become weak or fail during normal operation of the memory due to manufacturing weaknesses or defects, or due to stress from operation in the field. A failed bit may lead to errors in the memory or failure of the entire memory. Many different techniques and hardware has been developed to test the bits of the memory for failure. As memory increases in capacity, the complexity of the memory increases. It is a challenge to create a redundant memory architecture and replacement algorithm for a complex IC to extend the life of the IC as long as possible.

If a core memory provides for extra rows or columns of cells, referred to as redundant memory, in the array of non-redundant rows and columns that store the user data, then the redundant rows or columns can be used to replace the non-redundant rows and/or columns as they fail. But if the quantity of redundant rows and columns are slated only to a particular grouping of non-redundant memory, referred to as a bank or a block of memory, then the actual quantity of redundant rows or columns may be insufficient to meet the failure rate of one or more blocks in the core memory, resulting in an overall failure of the part and downtime of the system to replace the memory. Similarly, if the quantity of redundant rows and columns slated for each bank of memory is too high, then the part may not fail, but the part may be overdesigned or oversized for the application. A redundant row or column can be used to replace a non-redundant row or column when some, or nearly all, of the memory cells are functional and not defective.

Figure 1:
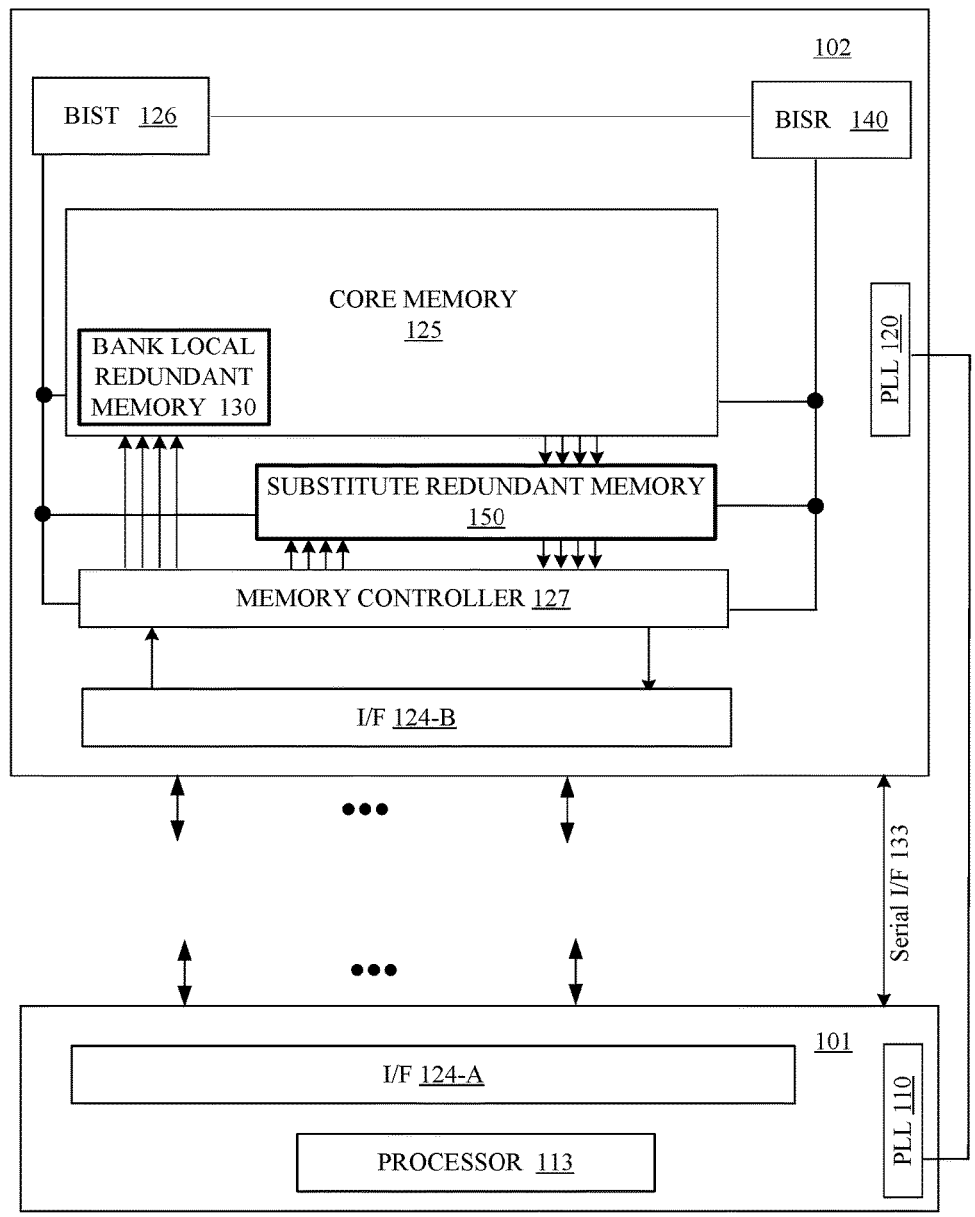
FIG. 1 is a block diagram of system having a host processor and an IC with a substitute memory for transparent in-service repair of memory, in accordance with embodiments of the present disclosure.

The drawings referred to in this description of embodiments should be understood as not being drawn to scale except if specifically noted.

SUMMARY

A system, method, and apparatus for memory redundancy and memory repair are presented. The present disclosure solves problems of granularity by offering single or multi-bit repairs rather than entire row, column, or word replacements. Importantly, the repairs to memory can be implemented and enabled on the chip in real time, as the failures are detected on or reported to the chip, and while the chip is in field service, in a background manner that is transparent to a user, with no change in rated timing or performance of accesses to memory. Thus no interrupts, holds, or resends are required with the repair to memory as described herein.

An integrated circuit (IC) chip includes an interface, core memory, as well as substitute memory disposed apart from, or outside of, the core memory that is backwards compatible with the local redundant memory. The substitute memory block (SMB) includes an address matching circuit, a random access memory (RAM) of substitute memory cells, and data selection circuitry coupled together. The address matching circuitry is implemented in a content addressable memory (CAM), for comparing known defective memory addresses, or word addresses, against an address of an incoming access request to determine if a match occurs. The RAM stores an address that was created by a built-in self-test, a test bench test, or a host user to discretely identify which bit in the word is defective. The RAM also stores an accurate bit data whose value will be substituted for the defective bit. Both pieces of information in the RAM are associated with a respective known defective-word address stored in a CAM so that the RAM and CAM are data linked, as known by those skilled in the art. A mux exists for every bit in a word that is read out on a bus so that a data value from substitute memory can be substituted in the word while the word is being communicated on the read access datapath. Similarly, a mux exists with inputs for every bit in a word from a write access to core memory. An accurate data value on the incoming write word is selected from the known bit location in the defective-word address and is saved to a RAM address that associates it with the bit location and the known defective-word address. Thus, the substitute memory will contain the accurate bit data for a known bit location in a known defective-word address. In comparison, the substitute memory acts similar to redundant memory to repair a defective word, but the substitute memory is neither redundant with every bit in the word, nor with every bit in a column or row, as local redundant memory can be.

When the address matching circuit identifies a match for a read access request to core memory, a portion of the substitute memory containing the bit location address will enable an appropriate one of the data selection circuit to exchange a substitute bit for a defective bit in the word containing the defective bit, after that word is read out of core memory and communicated to the interface in a seamless manner. The repair occurs in the datapath, or data stream, as the word being communicated between a core memory and an interface, for both a read and a write access. When a match occurs for a write access address, the data selection circuit selects the specific bit location and saves the value of the bit at that location to the substitute memory, because that bit will also be written to the defective memory cell in core memory. In this manner, the data selection circuit can substitute the correct bit value during a subsequent read to the same address, as just described. Thus, regardless of whether the correct bit is written to a defective memory cell in core memory, or a defective bit is read from the defective memory cell in core memory, the substitute memory block polices the activity to ensure the accurate data bit is maintained in the IC and accurate data is properly communicated to a user.

The data selection circuit selectively and surgically extracts a correct bit from a word being written to core memory, or selectively and surgically substitutes a substitute bit for a defective bit in a word that is read out from core memory. The data selection circuit does so by selecting an appropriate bit-selection circuit, i.e., a mux, associated with the defective bit in the word. As an example, if a word in a read access has a defective-bit location 5 out of the 72 total bits in the word, then substitute memory communicates an accurate substitute bit value for bit location 5 to all 72 muxes, but only the mux for bit location 5 is enabled to pass the substitute bit into a newly created corrected word. The mux for bit location 5 is selected by a decoder that reads the bit address location stored in CAM that is associated with the defective address. All other 71 bits from the word read from core memory pass through their respective muxes unaltered, because they had non-defective memory cells. If a word is not associated with any defective memory cells in core memory, then when the word is read out of core memory, or written into core memory, then the word is not changed when it interfaces the data selection circuit. A defective address is a valid address that actually refers to the defective memory cell in core memory. Similarly, a defective bit is the defective data value in a word that is read out or written to a defective memory cell in core memory.

The substitute redundant memory is effective at improving yield at production tests and improving mean time between failures (MTBF) for in-field operation from any of multiple failure modes such as weak, degrading, or catastrophic memory failures, and for intermittent performance due to variable retention times (VRT), or random telegraph noise (RTN), that might affect a range of granularity of memory cells, e.g., evenly spaced single bit intermittent performance or multiple memory bits geographically clustered on a chip. Redundant memory can be allocated and memory repair techniques can be tailored for VRT and RTN using the features described herein.

DESCRIPTION OF EMBODIMENTS

Reference will now be made in detail to embodiments of the present technology, examples of which are illustrated in the accompanying drawings. While the technology will be described in conjunction with various embodiment(s), it will be understood that they are not intended to limit the present technology to these embodiments. On the contrary, the present technology is intended to cover alternatives, modifications and equivalents, which may be included within the spirit and scope of the various embodiments as defined by the appended claims. Furthermore, in the following description of embodiments, numerous specific details are set forth in order to provide a thorough understanding of the present technology. However, the present technology may be practiced without these specific details. In other instances, well known methods, procedures, user interface controls, and circuits have not been described in detail as not to unnecessarily obscure aspects of the present embodiments.

The present technology provides for many examples of repair memory. The following discussion will demonstrate various hardware, software, and firmware for substitute redundant memory (SRM) in various embodiments of the present technology. Furthermore, the systems and methods may include some, all, or none of the hardware, software and firmware discussed below.

Referring to the figures, exemplary embodiments of the technology will now be described. The following description will focus on embodiments of the present technology, which are systems and methods for SRM for the hardware, or in one specific embodiment, global bit redundancy (GBR) for the data stream. GBR indicates that a redundant repair is available from a global set of resources to every memory cell in the core memory. The present technology, however, is not limited to any one particular device, operating system, environment, or platform. Instead, those skilled in the art will find that the system and methods of the present technology may be advantageously embodied on a variety of different memory devices used in a variety of different platforms. Therefore, the description of the exemplary embodiments that follows is for purposes of illustration and not limitation.

System

Referring now to FIG. 1, a block diagram of an IC 100-A with a serial interface and a shared redundant memory, aka substitute redundant memory 150, is shown, in accordance with one embodiment of the present disclosure. System 100-A includes an accessing, or host, device 101 coupled to, and communicating with, a memory device 102, e.g. on a line card. Memory device 102 can be a commodity memory or a specialty memory such as a low-latency, high throughput memory having on-die computing power to assist in providing local operations, algorithms, and other functions to offload tasks from the host 101. Accessing device, or host, 101 may be, for example, a system-on-a-chip (SOC) that includes a processor 113 and interface (I/F) 124-A that initiates accesses to memory device 102. Accessing device 101 is coupled to memory device 102 using any link, such as a parallel link, a serial link, an optical link, etc. to communicate data, address, and command information. Any type of communication protocol can be utilized over the link. One such example is an instruction set architecture ("ISA") presented in the commonly owned U.S. Pat. No. 8,473,695 to Mike Morrison et al., entitled "MEMORY SYSTEM INCLUDING VARIABLE WRITE BURST AND BROADCAST COMMAND SCHEDULING", issued Jun. 25, 2013, which is hereby incorporated by reference in its entirety.

Note that data flows in parallel from controller 127 to both substitute redundant memory 150 and to core memory 125, because a write will write into core memory 125 regardless of whether there is a defective memory bit or not and a write will be presented to SRM 150 in case data needs to be extracted. The term 'bit' typically refers to a binary digit that is read into and out of a physical 'memory cell.' However, the effect of a defective physical memory cell is to output a defective data bit from the memory cell. Consequently, these terms are sometimes used interchangeably to indicate the same problem. A defective memory address is one that points to a region of core memory having a known defect in one or more memory cells that will affect the reliability and accuracy of the data they store and output.

An important feature is that the substitute redundant memory 150 receives the word data to be written with all the accurate bit data, and extracts the specific bit of accurate data as determined by BIST 126. Note next that data flows in series from core memory 125 back out to interface 124-B. Thus, any data read from core memory 125 must traverse substitute redundant memory 150. And when the word does pass through substitute redundant memory 150, the accurate data for the bit in question is substituted back into the word in a transparent manner, such that data integrity is maintained.

Referring now to Table 1, a 72-bit word is to be written into memory in Step A. However, in step B1, the data stored in memory has a known defect at bit location 3. Thus, step B2 in parallel stores the accurate data bit of "1" from the write word into a 1-bit SRAM in substitute memory (SM). When the same word is desired to be read from memory in step C1, the defect from the core memory (CM) appears, but in parallel, the accurate bit data is also read from substitute memory (SM) in step C2. Finally, in the merging operation of step D, the accurate SM data bit is substituted in for the defective bit from CM, with the balance of bits from the word read from core memory 125 unchanged. The result is a corrected word that accurately preserves data written to it, and read from it, by host 101.

TABLE 1

Example Write & Read from Core Memory using Substitute Memory

|  |  | BIT LOC→ | | | | | |
|---|---|---|---|---|---|---|---|
|  |  | 0 | 1 | 2 | 3 | ... 70 | 71 |
| STEPS | A. Word to be written | 1 | 1 | 0 | 1 | ... 1 | 0 |
|  | B1. Word Stored in CM | 1 | 1 | 0 | DEFECT | ... 1 | 0 |
|  | B2. Bit Stored in SM |  |  |  | 1 |  |  |

TABLE 1-continued

Example Write & Read from Core Memory using Substitute Memory

|  | BIT LOC→ | | | | | |
|---|---|---|---|---|---|---|
|  | 0 | 1 | 2 | 3 | ... 70 | 71 |
| C1. Word Read from CM | 1 | 1 | 0 | DEFECT | ... 1 | 0 |
| C2. Bit Read from SM |  |  |  | 1 |  |  |
| D. SM bit substituted into CM word | 1 | 1 | 0 | 1 | ... 1 | 0 |

Memory controller 127 performs accesses to core memory 125. Core memory 125 includes non-redundant memory cells and optional legacy local redundant memory cells, illustrated as a flat, level memory in the present figure. However, the present disclosure is well suited to any grouping of memory, as known by those skilled in the art, and described hereinafter in FIGS. 2 and 3A-3D. Accessing device 101 and memory device 102 include phase lock loops (PLLs) 110 and 120, respectively, which generate internal clock signals in response to a common system clock SCLK. In another embodiment, the present disclosure is well-suited to asynchronous communication between devices 101 and 102, without using SCLK.

Memory device 102 includes local redundant memory 130 capable of replacing an addressable length of a word of memory cells, e.g., 72 bits, that are slated for access in the core memory, with a same quantity of memory cells in the local redundant memory, e.g., 72 bits, wherein the accessed word has one or more defective memory cells and the quantity of local redundant memory cells has no defective memory cells. In comparison, the substitute memory block 150 contains fewer memory cells, e.g., 1 bit, than the addressable length of the word, e.g., 72 bits, of memory cells slated for access in the core memory. The substitute bits from the substitute memory 150 are substituted for the defective bits in the word accessed from core memory while the word is on a data path between the core memory and the interface of the IC.

In one embodiment, memory device 102 also comprises an optional built-in self-repair (BISR) 140 and optional built-in self-test (BIST) 126, coupled to each other and to core memory 125. BISR 140 is built-in self-repair module that may be composed of hardware and software components. The BISR 140 can selectively schedule a repair of faulty memory cells using substitute memory redundancy, or a repair of row and/or columns of memory cells, using local redundancy memory, for defects caused by a weak transistor, sense amp malfunction, or some other hardware that affects the reliability of the stored data.

A memory device may comprise a plurality of banks or memory blocks, each memory block further comprising core memory cells, or bits, for carrying out the operations of the memory device. During normal operations of the memory device, a bit may fail within the memory block. Such a failure may lead to errors or complete failure of the memory device. Each memory block may comprise a self-contained repair element such as a built-in self-repair (BISR) module. The BISR module is able to test memory bits and detect failures or other performance weaknesses, or errors in the bits. The BISR module may then replace or otherwise fix the failed memory cell using a redundant memory cell from a local redundant memory. Each memory block may include a local redundancy. Because a unique instance of a local redundancy is associated with, or shared across, a specific memory block, the BISR module may use a redundant bit from the local redundancy to repair a failed bit within the same memory block without complications in addressing. In other words, a lengthy address is not required to employ the redundant bit in the memory block because the redundant bit comes from a local redundancy associated with the memory block.

In one embodiment, the present technology provides a GBR that comprises redundant bits that may be used by a memory block to replace, repair, or otherwise fix a failed bit within the memory block. In one embodiment, BISR module detects a failed bit in a memory block. The BISR module may then repair the failed bit using a redundant bit from the local redundancy associated with the memory. However, if the local redundancy has no redundant bits available, then the BISR module may employ a global redundant bit from the GBR to repair the failed bit. The GBR may be associated with a plurality of memory blocks. Thus the capacity of each memory block need not be increased and the memory blocks that are in need of more redundant bits than their local redundancy can provide may use redundant bits from the GBR.

Additional control information that can be communicated from the host 101 to the memory device 102 includes information about what word addresses in memory device 102 is defective, how the bit replacement technique should be implemented, etc. This can be accommodated via serial link 133 as a low-speed inter-chip serial interface bus for communication and interoperability between chips, using standards such as SMBus, I2C, SPI, e.g., for programming test patterns, repair algorithms, redundant memory resource allocation, repair thresholds, etc. using a protocol such as joint test action group (JTAG).

In one embodiment, device 102 is primarily a memory device with little logic. In another embodiment device 102 is a memory with processing capabilities, and thus is a hybrid between a memory and a microprocessor. In yet another embodiment, device 102 is primarily a microprocessor, whether a general purpose (GP) graphics processor unit (GPU), digital signal processing (DSP), etc. In yet another embodiment, device 102 is a field programmable gate array (FPGA) with memory.

Banked Memory

Figure 2:
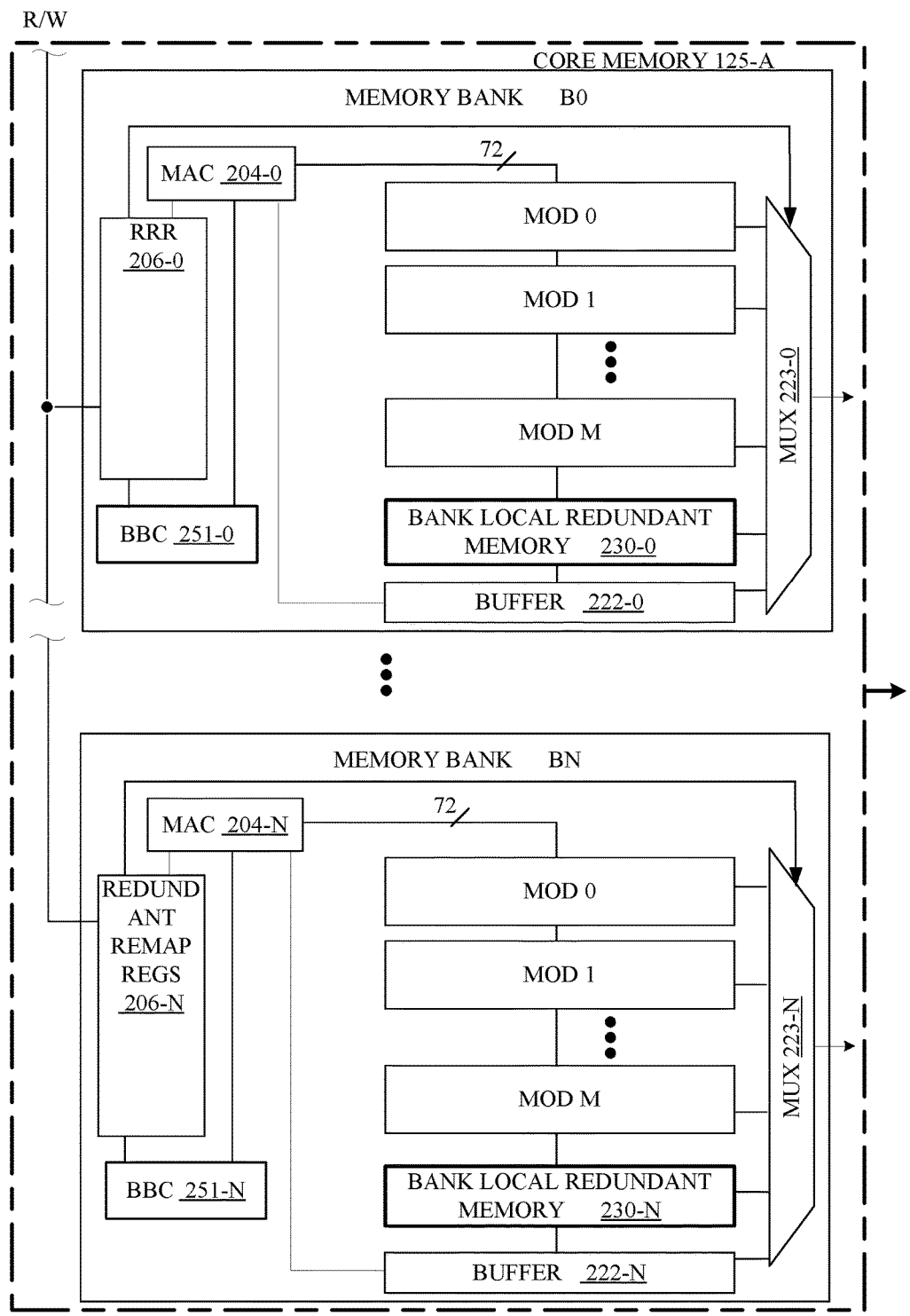
FIG. 2 is a block diagram of a memory partition M0 having a plurality of banks with each having a local redundant memory, in accordance with embodiments of the present disclosure.

Referring now to FIG. 2, a block diagram is shown of a core memory 125-A having a plurality of memory banks with each bank having a local redundant memory accessible only to the host bank, in accordance with one embodiment of the present disclosure. Only bank 0 (B0) is expanded to illustrate the common elements to each of the banks listed through quantity N, where N is 63 for a total of 64 banks in the present embodiment.

Memory cells in core memory 125-A are grouped into a lowest granularity called a memory module, or memmod. Specifically bank B0 comprises a plurality of memmods 0 through M, where M is 31, for a total of 32 memmods that are selectively output via MUX 223-0 through 223-N, for respective memory banks. Adding a local redundant memory memmod (Red_Memmod), i.e., redundant memory cells 230-0, shown at the bottom of the memmods results in a total of 33 memmods. While the present core memory is shown having banks as the highest level of grouping of memory cells, the present invention is well-suited to grouping multiple banks into a grouping called partitions, with the core memory containing multiple partitions, as shown in subsequent figures. More detail on the hierarchical memory design used in the present embodiment is provided in commonly owned U.S. patent application Ser. No. 12/697, 141 to Michael Miller et al, and entitled: "HIGH UTILIZATION MULTI-PARTITIONED SERIAL MEMORY," filed Jan. 29, 2010, which is hereby incorporated by reference in its entirety.

In bank B0, memory access controller (MAC) 204-0, is coupled to Redundant Remap Registers (RRR) 206-0. MAC 204-0 acts as a decoder to decode commands, and addresses, and is coupled to and controls the specific memmods, rows, etc. that are requested. RRR 206-0 is a block that provides a comparing operation and a match identification operation, e.g., using a content addressable memory (CAM) structure, such as a ternary CAM (TCAM) or logic gates, such as an XOR array. An example of a CAM operation is provided in U.S. Pat. No. 4,723,224 entitled "CONTENT ADDRESSABLE MEMORY HAVING FIELD MASKING" issued Feb. 2, 1988, which is incorporated by reference herein. RRR 206-0 compares incoming addresses of an access request against known defective memory location addresses within the given memory bank, and indicating a match, that would then provide a substitute address that holds the valid data. The substitute address can point to the local redundant cells, i.e. 230-0 for bank B0. Redundant memory cells 230-0 can be used both for production test and repair and for in-field repairs, though the latter would require an interruption in service to allow for the part to be reset and the scan chain of repair information be streamed into partition memories.

In prior art designs, if local redundant memory cells are exhausted for a given memory block, then subsequent memory cell failures in that same block would result in faulty data being stored and read, an unacceptable condition. In some cases, the memory chip may be deemed a failure because of even one memory cell resulting in faulty data being stored in the memory bank. Sometimes other recovery mechanisms exist, such as error correction codes (ECC) that can be used to correct single bit failures and detect, but not fix two-bit failures in a word. This is where redundant memory that is shared amongst a plurality of memory blocks provides a benefit. Failures of memory cells in a memory chip can be irregular. For example, even if 99% of memory in the memory blocks have a negligible quantity of failures, and don't begin to tap into their local redundant memory there is still a chance that the remaining 1% of memory cells might exceed the local redundant memory resources located in their memory block. And this can cause an early failure of the entire part. One solution is to increase the local redundant memory located in each of the memory blocks. However, that is wasteful because again, the vast majority of the memory blocks won't need it. And the extra redundant memory scales with the number of memory blocks in a chip. Thus, it is the unpredictability of determining which memory block will have the excessive failures that becomes the issue. In response, the present disclosure resolves this problem by providing a substitute redundant memory shared across a given plurality, or all, of the memory blocks in a chip. In this manner, regardless of where the excessive failures occur, there is a reasonable quantity of shared memory redundancy resources to replace the failed cells that would have otherwise exceeded a given memory block's local redundant resources. A hybrid combination of using the local redundant memory and the shared redundant memory resources provides for most common failure modes.

One embodiment of BIST 126 from FIG. 1 is implemented as redundant remap registers (RRR) 206-0 for an optional background built-in self-test (BBIST) on memory bank B0 in conjunction with background BIST controller (BBC) 251-0, as shown in FIG. 2. BBC 251-0 controls the test by selectively writing data from a portion of a memmod, e.g., MOD 1, to an SRAM buffer 222-0, so the data is available for a read or write access, while MOD 1 is undergoing local testing while the unit is still in service in a manner that is transparent to a host device making the access. Thus RRR 206-0 compares an address for an incoming access to determine if it maps to: the original address in one of the non-redundant memmods, i.e. MOD 0 through MOD M; to a remapped address to local redundant memory, 230-0, because of a defective bit in the non-redundant memmod; or to buffer 222-0, in the case where the address to be accessed is under local BIST. Because buffers, e.g. 222-0, are in the datapath for reading and writing data between the interface and the core, they also benefit from, and are included in, automatic substitute memory repair operations in a transparent and seamless manner. More detail on a programmable test engine is provided in commonly owned U.S. Pat. No. 8,954,803, to Rajesh Chopra, entitled "PROGRAMMABLE TEST ENGINE (PCDTE) FOR EMERGING MEMORY TECHNOLOGIES", issued Feb. 10, 2015, which is hereby incorporated by reference in its entirety.

The BBIST feature is not required for implementing the present solution of substitute redundant memory, as the defective memory bits to be repaired can be identified by other means such as production testing or by a host device use of error detection and correction ("EDC") per an error correction code ("ECC").

Once an error is detected in a block, the address information is communicated to a substitute redundant memory block slated to the given portion of memory with the defect, as will be described in subsequent FIG. 3A. Alternatively, or additionally, the address information can be communicated to BISR engine 370 as described in FIG. 3A for management of the repair, or making the repair information permanent, e.g., via programming eFUSE.

Distribution & Hierarchy of Substitute Redundancy Memory

Figure 3A:
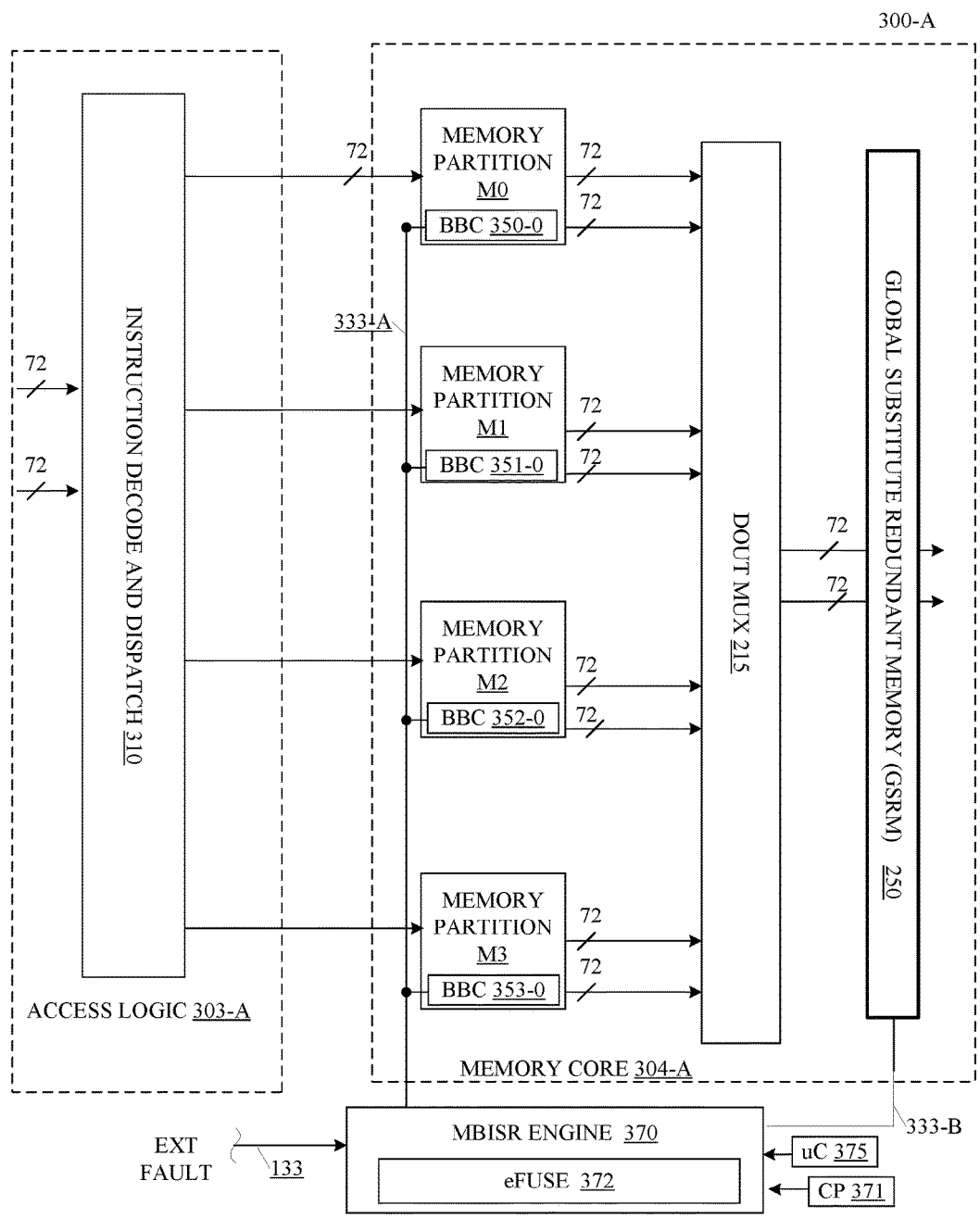
FIG. 3A is a block diagram of an IC with a centralized global shared redundant memory usable for production or in-field built-in self-test (BIST) and built-in self-repair (BISR), in accordance with embodiments of the present disclosure.
Figure 3B:
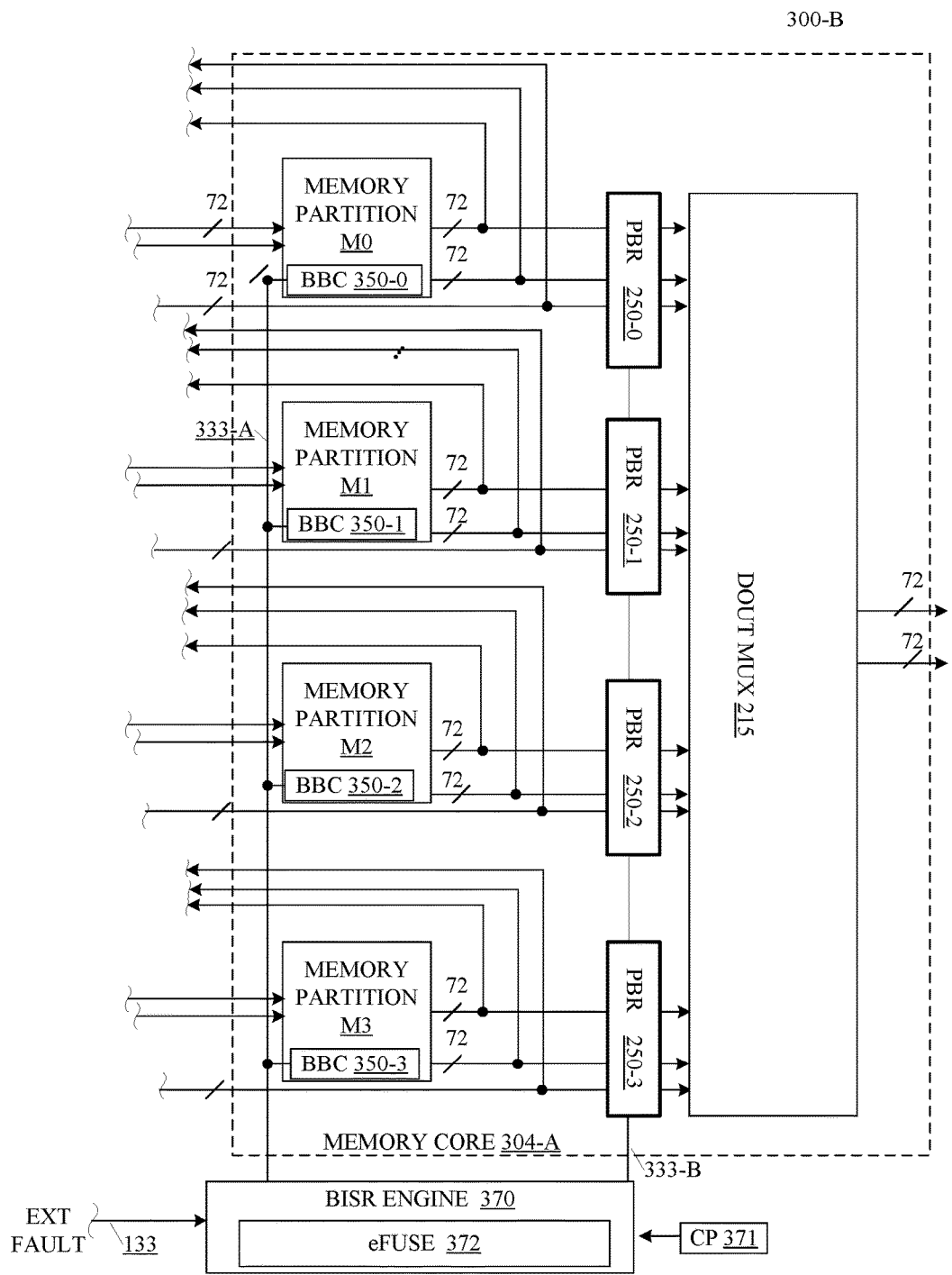
FIG. 3B is a block diagram of an IC with a distributed partition shared redundant memory usable for production or in-field BIST and BISR, in accordance with embodiments of the present disclosure.
Figure 3C:
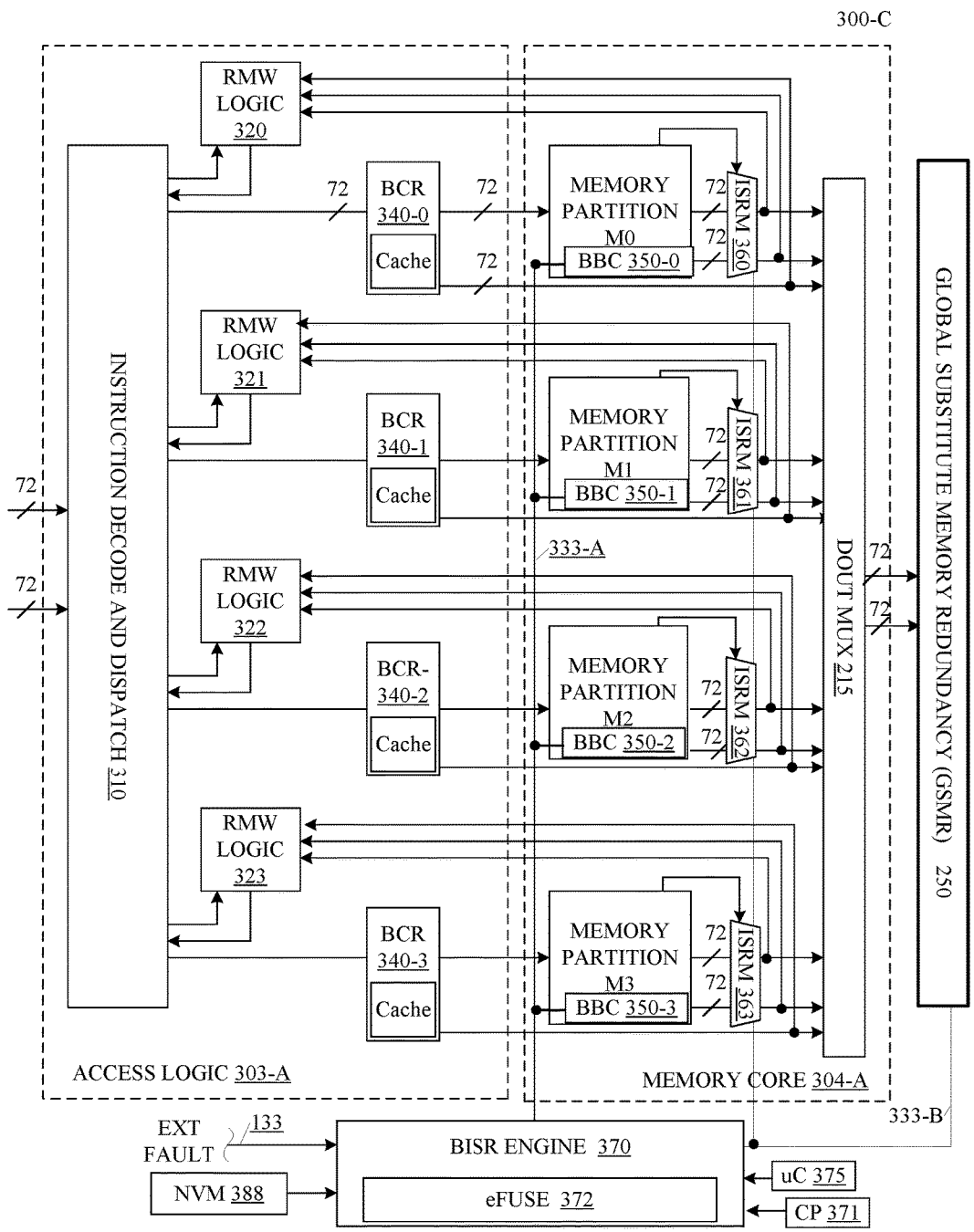
FIG. 3C is a block diagram of an IC with a hierarchical arrangement of multiple shared redundant memory resources, in accordance with one variation of the present disclosure.

FIGS. 3A-3C illustrate several of the many possible permutations and combinations of using SMB in a memory in terms of hierarchy, granularity, heterogeneous/homogeneous configuring, etc., depending on the application. The SMB can be a single, central block globally available to any and all memory cells in core memory as shown in FIG. 3A. Or the SMB can be a distributed blocks individually slated to one or more unique groupings of memory, referred to as partitions herein, where the distributed blocks together result in global access to all memory cells as shown in FIG. 3B. Finally, in FIG. 3C, multiple SMBs can be concatenated together to perform serial repairs on a word and thereby provide additional redundancy of limited repair resources. SMBs can have different granularities for repair, such as a granularity that replaces a single bit at one SMB level, and a granularity that replaces a word at another level. The SMBs are programmable and reprogrammable, in that an address with a defect can be added to, deleted from, or moved between address matching circuits in different SMBs to accomplish different repairs, as changes in IC performance and defect modes arise.

As shown in the subsequent figures, the substitute redundant memory can be located centrally or distributed amongst the memory blocks. The substitute redundant memory can be at a single level, or at multiple levels, with a hierarchical replacement scheme for the latter. The shared redundant memory can be utilized with or without local redundant memory. If used with local redundant memory, then a scheme can be used for replacement of failed or weak memory cells in a manner that accounts for the failure mode, resources available, history of failures in the memory block, etc. in order to maximize the lifespan of the IC.

In an SRM, memory resources can be shared amongst multiple instances of groupings of memory. For example, a core memory hierarchy in an IC can be grouped into four partitions at the highest level, with each partition having groupings of blocks, or banks, of memory at the next level, e.g., 64 blocks, and with each block of memory having a grouping of a quantity of rows of memory cells, referred to herein as a memory module, or memmod, e.g., 32 separate memmods in each block. A memory redundancy scheme that shares memory resources across two or more of the lowest memory groupings, i.e. memmods, is referred to as a lowest memory redundancy (LMR). With LMR, the memory modules, would require an address location longer than the address for the memory module itself, so as to uniquely identify which memory module to which the redundant memory cell would be slated, and to which bit from a memory module would be replaced by the bit from the shared redundant memory.

Referring now to FIG. 3A, a block diagram 300-A of an IC with a global substitute redundant memory usable for production or in-field built-in self-test (BIST) and built-in self-repair (BISR) is shown, in accordance with one embodiment of the present disclosure. A highest level of SRM is shown herein as a global memory redundancy (GMR) or universal memory redundancy (UMR). In this architecture, a central block of redundant memory resources are shared globally amongst all memory cells in the core memory of the IC. Thus for example, using the exemplary memory above, GMR would be accessible to every memory cell in the IC, regardless of location in the IC. If the resolution of repair of that GMR was on the basis of a single memory cell by single memory cell, e.g., to replace a single bit by single bit portion of a data word being read from memory, then that embodiment of GMR would be called a global bit redundancy (GBR). If the entire substitute memory resources are consumed, then the chip might not be repairable in-service. Thus, there is little waste of substitute memory cells.

FIG. 3A also illustrates a BIST background controller (BBC) slaved to each bank in each memory partition M0-M3, shown as BBC 350-0 to 353-0 for the top level bank, with BBCs existing for every bank in the partition (not shown). Coupled to BBC 350-0 to 350-3 is a memory BISR (MBISR) engine 370 having an eFUSE block 372 disposed therein. On-die charge pump 371 is coupled to eFUSE block 372 to provide sufficient voltage boosting in the field such that, with a traditional power supply, charge pump (CP) 371 can generate a voltage level above a threshold to program an eFUSE. The use of substitute redundant memory, referred to as global bit redundancy, can be used for production repairs or for in-field repairs. Addresses of failed memory locations can be retained in volatile RRR 206-0, as shown in FIG. 2, or can be programmed into an eFUSE block, e.g. central eFUSE block 372 shown in FIG. 3A. In an alternative embodiment, any combination of eFUSES for any purpose can be designated by design or selectability.

This repair mapping is collected and made available for use immediately, so that the product is error free as seen from the user. The repair mapping can be programmed into eFUSES 372 via line 333-A before power-down or at regular intervals to ensure that the information is stored if there is a power-down or reset. As noted, eFUSE programming can be performed in the field using on-die charge pump 371 of FIG. 3A. The eFUSE value is read out of eFUSE block 372 via line 333-A into respective memory partitions M0 through M3 and stored into redundant remap registers (RRR) block 206 of FIG. 2, either real time, or upon initializing of memory partition M0. RRR block 206 communicates the repair information in registers via line 333-B of FIG. 3A to global substitute memory redundancy (GSRM) 250, as described in FIG. 3A, for replacing said bad bits output from memory partitions M0-M3.

Serial link 133 couples external automatic test equipment or a host 101, as shown in FIG. 1, to input parameters for BIST and BISR into MBISR engine 370, as controlled by microcontroller 375. Once a fault is detected, whether by production-level automatic test equipment (ATE), in the field background BIST, or an external in-field source such as host 101, an eFUSE can be programmed in eFUSE block 372. The eFUSE block can be partitioned with appropriate amount of fuse resources divided between production test and in-field repair, the latter being a fraction of the former in the present embodiment. GSRM 250 is coupled to BISR for optional programming of eFUSES 372. The faulty cell address information is thus captured in hard coded eFUSES. In turn, this address information is provided to registers, such as RRR 206-0 in FIG. 2 for local redundant memory, e.g., 230-0, or such as registers in RAM 483 of FIG. 3D for substitute bit data in RAM 483, respectively, that subsequently relay it as control data to operate multiplexers in the data stream that redirect reads or writes to replacement addresses. The captured information includes failures repaired by both half-column replacements in production testing using local redundant memory, or single or multi-cell failures repaired by GBR. The host device or the on-die device can use a default protocol to record these values, or can selectively record the repair data based on other inputs and metrics. The BISR can selectively replace faulty memory cells, or row or columns of memory cells, caused by transistor faults, sense amp malfunction, or some other hardware that affects the reliability of the stored data.

The in-field repair can be initiated by memory device 102 via internal BIST, i.e. BBC 251-0 of FIG. 2, or an external (EXT) fault via serial link 133, e.g., from access device 101, as shown in FIG. 1. MBISR engine 370 includes logic to initiate an eFUSE programming operation. A programmed eFUSE will then configure either a MUX to redundant memory resources inside memory partition M0-M3, as needed, or configure a MUX in GSRM 250 via line 333-B that screens data output from memory partition via DOUT MUX 215. Global redundancy block 250 can either be disposed downstream of DOUT MUX 215, in which case it would have to run at four times the rate of the individual partitions, or it can be disposed upstream of DOUT MUX 215, as shown in subsequent FIG. 3B, and operate at the lower speed of the individual partitions. FIG. 3A utilizes GSRM 250 on a homogenous type of memory cell construction of the core memory in each of memory partition, M0-M3, whether that memory construction is embedded DRAM, commodity DRAM, SRAM, flash memory, etc.

Simultaneously, the input data address and control are also communicated to an SRM, along with the fail information, i.e., the failed address information determined from MBISR engine 370 of FIG. 3A, from bench testing, or from a host processor forensic analysis of memory data in the field. The list of failed addresses can be stored centrally, for access to all memory blocks with access to the SRM.

While FIG. 3A illustrates a single GSRM 250 for the four partitions, any granularity of a GBR scheme can be used, including combinations of a single GBR slated to each partition, with an optional hierarchical GBR filtering the output from all the partitions.

Referring now to FIG. 3B, a block diagram 300-B of an IC with a partition-based shared redundant memory usable for production or in-field built-in self-test (BIST) and built-in self-repair (BISR) is shown, in accordance with embodiments of the present technology. The distributed SRM shown herein provides a partition-based bit redundancy (PBR), because every memory cell in the core memory has access to substitute memory, but only to distributed redundancy resources, rather than a single central bank of resources. Thus, if a given partition has excessive defects, it may consume resources in its PBR block, e.g., 250-0, while other PBR blocks, e.g., 250-1, have excess redundancy resources. However, the addressing and layout of PBR is simpler than GBR. Consequently, the choice of the distribution of substitute memory resources depends upon the application. In the present embodiment, each of the substitute memory blocks is slated to constituent memory banks of a particular partition, with no overlap.

Referring now to FIG. 3C, a block diagram 300-C of an IC with a hierarchical arrangement of multiple levels of shared redundant memory resources is shown, in accordance with one embodiment of the present disclosure. In particular, a substitute memory resource, that is slated to a particular group of memory cells, is located at an intermediate level, e.g., at a partition level, as shown by intermediate substitute memory redundancy (ISRM) 360-363. Each ISRM 360-363 is slated to a specific single memory partition M0 through M3, respectively, but not all the memory partitions, in the datapath between core memory and the interface. Alternatively fewer ISRM blocks could be used to capture multiple partitions, such as two ISRM blocks servicing two partitions each. If one of the ISRM 360-363 exhausts its resources, then the IC can rely on the next higher level of SRM, the global SRM (GSRM) 250 that is available to all memory partitions M0-M3. In this manner, the life of the IC is prolonged, despite exhaustion of local or intermediate substitute memory redundancy, thus reducing in-field repair and replacement, down time, loss of service, and the costs associated therewith. Alternatively, if two bits need to be replaced in a word, each level of SRM can replace a single bit in a serial manner with a fully corrected word presented to the I/F.

FIG. 3C also illustrates the use of substitute memory redundancy (SRM) as simultaneously applied to different types of memory cells, according to embodiments of the disclosure. While memory partition M0-M3 use embedded DRAM, or alternatively, commodity DRAM, the cache in each of bank conflict resolution (BCR) blocks 340-0 through 340-3 utilize static RAM (SRAM) for faster speed and to provide multi-port functionality to the single-port memory in partition M0-M3. Thus, for example, if a memory cell has a failure, or unacceptable or marginal performance, in either the SRAM cache of BCR 340-2, and if a memory cell in eDRAM of core memory in memory partition M2 has a failure, the unique address, based on the hierarchy level of the GBR application, of the failed bits from both types of memory, along with the correct data values for each, will be provided to GSRM 250 block for substitution when the data is read out. Hence, GBR has the capability of heterogeneous redundant memory repair across any combination of memory cell constructions; whether they be DRAM, Magnetic RAM (MRAM), eDRAM, SRAM, non-volatile memory, flash, thyristor RAM (T-RAM), ROM, etc. GSRM 250 is coupled to BISR for optional programming of eFUSES 372.

FIG. 3C is an alternative access logic and core memory of a memory device that provides multi-port access memory and function using single port cells in accordance with one variation of the present disclosure. More detail on bank conflict resolution is presented in commonly owned U.S. patent application Ser. No. 13/841,025 to Michael Miller, et al, and entitled "MEMORY WITH BANK-CONFLICT-RESOLUTION (BCR) MODULE INCLUDING CACHE," which is hereby incorporated by reference in its entirety.

The present embodiments provide a primary, secondary, tertiary, or higher level of failure repair depending on the quantity and location of the failures and the number of levels of SRM. Thus, the present disclosure provides a hybrid combination of heterogeneous repair architecture types including local redundant memory having a first architecture type, and the substitute memory having a second architecture type. The granularity of repair is also different for the different architecture types. For example, if core memory fails in production, then local redundant memory provides primary redundancy, at a first level of repair on a row or column basis. If local redundant memory for a given bank is consumed, or if the local redundant memory itself fails, or if a failure arises in service, then a first level of SRM provides secondary redundancy, such as that shown in FIG. 3A or 3B, for single bit substitution. Thereafter, one or more levels of SRM provide additional redundancy, such as that shown in FIG. 3C.

The present disclosure is well-suited to any granularity of memory cell redundancy/bit replacement, and any hierarchical level of the memory redundancy. Additionally, the redundancy can also be provided on some amount of memory less than the global bits, but more than a lowest grouping of memory cells. For example, certain types of memory cells, or location, or data slated for memory could have prioritization for redundancy resources during repair. Another embodiment would be intermediate memory redundancy (IMR) where the redundancy is placed somewhere intermediate, such as at the partition level, between the lowest level of memory grouping, the memory module, and the highest level of memory grouping, e.g., the entire block of memory on the chip. Finally, any combination of these substitute memory redundancy embodiments may be combined, such as LMR plus IMR, LMR, plus IMR plus GMR, LMR plus GMR, IMR plus GMR, etc. And the specific quantity of redundant memory slated for each of these levels of substitute memory resources could be fine-tuned to a given chips performance, failure mode, application, environment, manufacturing defects, etc.

Substitute Redundant Memory

Figure 4:
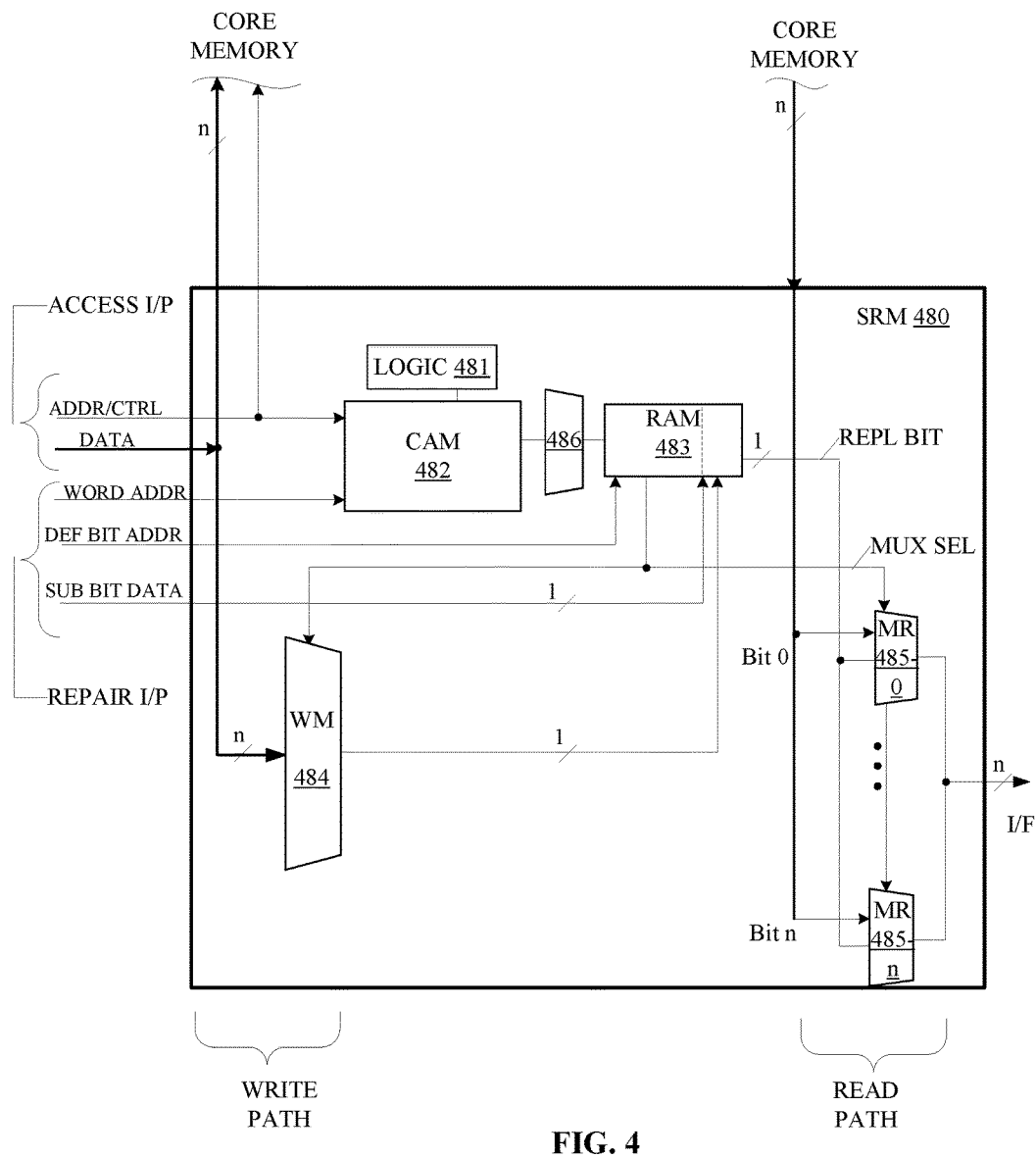
FIG. 4 is a block diagram of a substitute redundant memory block, in accordance with embodiments of the present disclosure.

Referring now to FIG. 4, a block diagram of a substitute redundant memory (SRM) block 480 is shown, in accordance with embodiments of the present technology. The SRM 480 comprises control logic 481, address matching circuitry, which are implemented as content addressable memory (CAM) 482, substitute memory cells, implemented as RAM 483, and data selection circuitry, implemented as bit-selection circuits, or muxes, MR 485-0 through MR 485-n, all of which are coupled together. The value n is the number of bits in a word that have access to redundant memory, e.g., 72 bits in the present embodiment. SRM 480 represents the basic construction a nominal SRM resource used at any level in an IC, be it centralized GBR 250, distributed PBR 250-0 through 250-3, or combination of intermediate ISRM 361-364 and global GBR 250, as shown in FIGS. 3A-3C.

The SRM resource 480 is slightly different when applied to a different level in the memory. For example, the size of the CAM 482 scales depending on the quantity of addresses to be read. Thus, an SRM resource for a GBR, i.e. FIG. 3A, will have a large CAM 482 to hold all the addresses in the core memory, with a length of address being long enough to identify partition, bank, etc., assuming all addresses are designed to be accessible to the SRM. A SRM in the form of a distributed GBR, i.e., FIG. 3B or 3C, or an intermediate SRM 360-363 will have a smaller CAM 482 that is sufficient to hold the addresses only for the memory coupled thereto, i.e. one partition worth of memory, rather than the entire core memory of four partitions in the present embodiment. Further, the address length that is stored is shorter because it does not include partition identification, since the SRM is slated to a single partition. The cell construction of cells in substitute memory is different from a cell construction used in core memory. Core memory is typically a dense array of memory cells, such as DRAM or 1T-SRAM cells, whose reliability problems can many times be fixed with sufficient quantity of local redundant memory. In contrast, the smaller quantity of substitute memory cells needed for repair, and the need for those memory cells to perform quickly and be more reliable, means they preferably have a robust cell construction such as SRAM, which is different from core memory. The architecture of the core memory is typically homogenous, e.g., all DRAM. The local redundant memory is typically the same memory cell and architecture as the core memory, and is addressable as a standard group of cells, such as a row, line, or word. In contrast, the architecture of substitute memory is a heterogeneous, combination of a CAM and a RAM memory for different functions. Similarly, the architecture of the substitute memory cell is different from that of the core memory cell. The dense packing in the array will create bit lines and word lines and sense amps in a manner that benefits tight packing and other tailoring requirements for DRAM. In contrast, the architecture and layout of the substitute memory cells as coupled to the CAM 482 and MUXs 485-0 through 485-n in the read word data path that is outside of the core memory, has an entirely different purpose, such as facilitating low latency.

CAM 482 holds memory addresses, i.e., a word address, for defective core memory that was not repaired by local redundant data. CAM 482 is coupled to address/control line from access input (I/P) lines for a read or write access to evaluate whether the address of the access matches a list of known defective addresses stored in CAM 482. CAM 482 is also coupled to address input line from repair I/P lines, from BISR, production bench testing or a host.

CAM 482 is coupled to RAM address encoder 486 which outputs a RAM address dependant upon the row in CAM 482 that has a match for a read or write operation. The output RAM address points to the data in RAM 483 associated with the exact address matched in CAM 482. RAM 483 holds the associated data for a defective memory address identified in CAM 482. The associated data includes the specific defective-bit location in a word, and the accurate bit value itself to be substituted in for that bit location. This associated data is stored in at a given row address in RAM 483. The dashed line in RAM 483 represents the split of RAM 483 on the left for an address corresponding to the bit location, and on the right for the single bit of accurate data. The memory for storing the single bit of accurate data can be referred to as substitute memory cells, which are not directly substituted for the direct write and read location like local redundant memory. Rather substitute memory cells are indirectly used to store accurate bit information for a write access and to output accurate bit data for a read access, in lieu of the defective core memory cell. The accurate bit data is integrated, or interleaved into the balance of bits of a word accessed from core memory to create a corrected word having no defects.

RAM 483 is coupled to MUXs for RAM (MR) 485-0 through **485-*n* by MUX select (SEL) line. MUXs 485-0 through 485-*n* are disposed in a read datapath of every word that is read from core memory to selectively output either a substitute data bit or a core memory bit. A decoder in the logic determines the signal to output on MUX SEL line to enable the appropriate mux for the substitute bit to be substituted in for the defective bit in a word received on the read path. If a hit occurs during a write, the same decoder provides a bit address to write MUX (WM) 484 that is associated with a defective bit that is destined for core memory, but is evaluated in parallel at SRM 480 to capture an accurate bit value in the word being written. RAM 483 is coupled to defect bit address (DEF BIT ADDR) line of the repair I/P lines to load known defective addresses, either from past history, e.g., from eFUSE 372 of FIG. 3A, or from new occurrences per BIST 126 and BISR 140 of FIG. 1. RAM 483 is also coupled to substitute (SUB) bit data line of the repair I/P lines to receive an accurate bit value that was determined by the BIST, if the data was recoverable during the test, e.g. via EDC. RAM 483 is also coupled to output of write MUX (WM) 484 to receive an update to a data bit value arising from a new write to a known defective address in core memory, as screened by CAM 482 and WM 484**.

Any granularity of bits in the word can be replaced, from a single bit to the entire word, including adjacent and non-adjacent bits within the word. The address for weak or failed core memory cells can be obtained from any of multiple sources including: production burn-in; a BBC running tests on the core memory in the field, or a host controller using the core memory, wherein the host controller is operating error detection and correction (EDC) operations on data received from known addresses in the IC.

A read or write command and address, as well as write data, is communicated via access input (I/P) lines to SRM 480 in FIG. 4 as received by an interface 124-B of the IC 102 of FIG. 1. Simultaneously, the input data address and control is also communicated to an SRM, along with the fail information, Data is also read from an accessed memory bank, e.g., Bank BN of Memory partition M0 of FIG. 2, and communicated to intermediate shared redundant memory (ISRM) 360.

A series of 2 to 1 muxes, MR 485-0 to MR **485-*n*, are coupled in parallel to receive both a bit of the accessed data and, if required, a bit of accurate data from a shared redundant memory. For most accesses, the core memory will not be defective, and the data read from the core memory will pass through muxes MR 485-0 through MR 485-*n* of SRM 480 unchanged. However, for an access to a failed memory cell in core memory, or a failed memory cell in local redundant memory, that itself replaced a failed memory cell in the core memory, e.g., memmod 0, the appropriate bits are selected via the muxes MR 485-0 through MR 485-*n*. For example, if a single bit memory replacement scheme is used, then only a respective one replacement bit will be substituted into the word of data by the respective mux. Thus, if a third memory cell in the core memory failed, e.g., col. #3 of row 16, in partition M0 of Bank B0, memmod 1, and a single bit replacement scheme was utilized, then the data word is accessed normally at the core memory, and upon egress from the core memory, SRM 480 intercepts and replaces the unreliable bit of data. It does this by an input select to the appropriate mux, i.e., mux MR 485-2 (corresponding to the third bit in the word), which selects an input from a shared redundant memory (corresponding to a reliable data bit for the third bit of the word accessed). SRM 480 knows the failed bit because the accessed address was identified as a known as having a faulty third bit, per the RAM 483. SRM 480 is operated in parallel to retrieve replacement bit data at the same time the read and write access is retrieving data from core memory. Thus, using SRM 480** has essentially no timing penalty beyond a multiplex function with one gate delay, which can be hidden.

SRM 480 can interface with multiple ports from interface 124-B. In that embodiment, multiple instances of the write path components such as access I/P lines and WM 484, will be provided to a single CAM 482/RAM 483 set, for accessing the list of known defective addresses for which the CAM 482/RAM 483 is responsible. Similarly, multiple instances of the write path will be provided for multiple write ports, including multiple instances of the data selection circuit, i.e., multiple sets of the MR 485-0 through **485-*n* for each port, and lines coupled to the RAM 483**.

First, substitute memory redundancy can be any granularity. That is, the GMR can replace an instance of a single memory cell, or a memory block dimension, such as one or more rows or columns of bits by having redundancy of equivalent size, e.g., one or more redundant rows or redundant columns, respectively Likewise, if the architecture is such that addressing the memory blocks is provided in a granularity that is sub-memory block dimensions, such as a fraction of the row or column in a memmod, i.e., a half-row or half-word, which would utilize a redundant element of equivalent size, e.g., a redundant half-row, etc.

While the present embodiment illustrates a single bit replacement, the present disclosure is well-suited to substituting multiple substitute bits in a defective word that is read from core memory. This design would require additional RAM for the extra bits and larger muxes to accommodate the plurality of potential substitute bits to replace the bit read from core memory for the word, up to a maximum of the length of the word. This design has the ability to replace any quantity of bits anywhere in a word, whether they are contiguous or not.

Operations

Figure 5A:
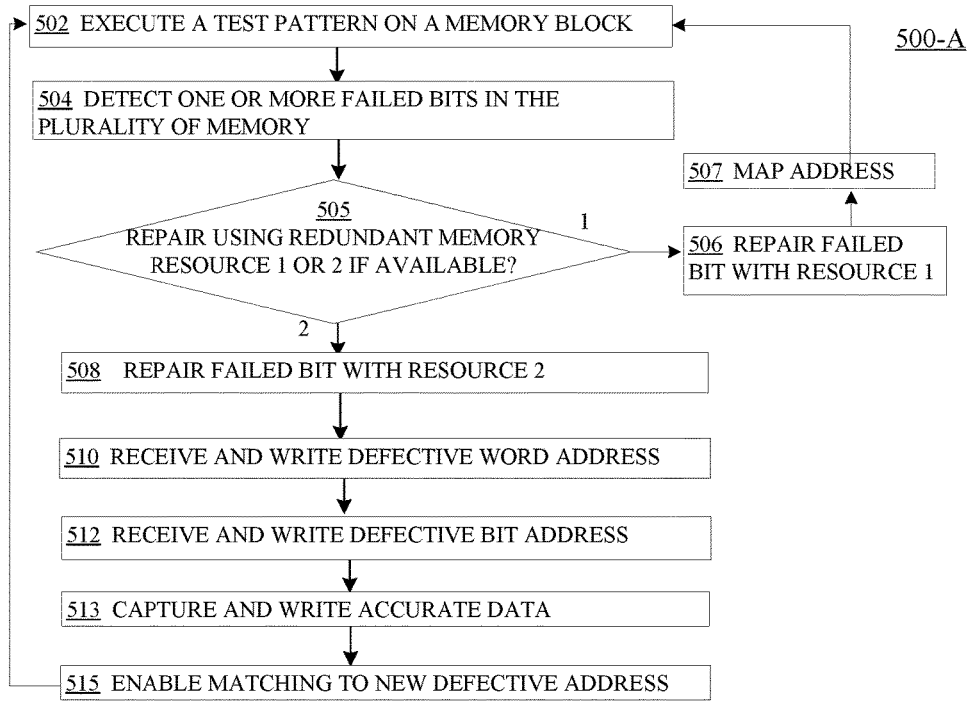
FIGS. 5A and 5B illustrate flowcharts of a method for repairing a failed bit in an integrated circuit chip using substitute redundant memory, in accordance with embodiments of the present disclosure.

Referring now to FIG. 5A, a flowchart is shown that illustrates process 500-A for repairing a defective bit in an integrated circuit (IC) chip using substitute memory redundancy and particularly global bit redundancy, in accordance with one aspect of the present disclosure. In one embodiment, process 500 is carried out, at least in part, by logic in the IC or by a specific or general purpose processor with optional electrical user interface controls under the control of computer-readable and computer-executable instructions stored on a computer-usable storage medium. The computer-readable and computer-executable instructions reside, for example, in data storage features such as computer-usable volatile and non-volatile memory and are non-transitory. However, the non-transitory computer-readable and computer-executable instructions may reside in any type of computer-usable storage medium. In one embodiment, process 500 is performed by the devices and components described in figures herein capable of executing instructions.

At operation 502, a test pattern is executed on a memory block of the integrated circuit by a test run either by automatic test equipment (ATE) or run by a built-in self-test (BIST) module on the IC, wherein the memory block comprises a plurality of banks with a plurality of memory bits. Any memory that can be tested and is in the datapath can participate in substitute memory repairs. For example, if production testing or BBIST is configured to test local redundant memory 230-0 and buffer 222-0, and other memories on the IC, then any identified defective addressable bit can be included in the repair operations described herein, regardless of the memory cell construction, architecture, reliability rating, etc.

At operation 504, a failed bit of the plurality of memory bits is detected, via the test. By using error correction code (ECC), an error detection and correction (EDC) algorithm can detect one bit defect and fix that bit, and can detect a two bit defect, without fixing it. The detection and address generation of the defective bit can be performed by BIST, or an on-chip or test bench microcontroller. The tests for memory functionality are performed on the core memory 125, and on local redundant memory in a bank, e.g., 230-0, or any other type of memory architected to be available for test in production or in-service. If the data flow is architected to provide a SRM in the datapath, then the SRM can repair that memory on the IC.

At operation 505, an inquiry determines whether repair should be performed using memory redundant resource one (1) or two (2). In the present embodiment, resource 1 is a local memory redundancy provided on a block level of memory, while resource 2 is a substitute memory redundancy (SRM). The algorithms to determine which repair is most appropriate depend on numerous factors such as: a quantity of local redundant memory available, a quantity of shared redundant memory available, a type of failure mode of the one or more defective memory cells, and an amount of time the IC has been in service. Resource 1 can be used with the present disclosure, even if the local redundant memory has defective memory cells included with the non-defective cells to which a word will be written and read. This is because resource 2 which, in this embodiment, is a substitute redundant memory can be used to repair the bit read out of the local redundant memory.

When using resource 2 for SRM, the repair can be performed transparently to a host 101 of FIG. 1 accessing memory 102, because BISR 140 has its own controller independent of memory controller 127. More information on memory repair is provided in commonly owned U.S. patent application Ser. No. 13/834,856 to Rajesh Chopra, filed Mar. 15, 2013, and now U.S. Pat. No. 8,988,956 issued Mar. 24, 2015, and entitled "PROGRAMMABLE MEMORY BUILT IN SELF REPAIR CIRCUIT," which is hereby incorporated by reference in its entirety.

At operation 506, the failed bit is replaced with a local redundant memory from a first resource, e.g., a local bit redundancy from resource 1, e.g., local memory redundancy, if available. Local redundant memory is enabled by operation 507 that maps a non-redundant memory address to a redundant memory address. With resource 1, a repair is effectuated by remapping a non-redundant memory address having the defect to a new address, typically in the local redundancy memory. Thus, an entire group of memory cells, e.g., a row, in the core memory is abandoned because of the failure, in the narrowest case, of a single memory cell. Configuring local redundant memory is typically performed in production and requires an interrupt to the IC and that the IC be taken off-line. After the repair, operation 502 is repeated to continue testing memory for errors.

At operation 508, the failed bit is repaired with a bit from redundancy resource two, e.g., substitute memory redundancy, if available at any level of hierarchy. Incorporated into the inquiry is a threshold as to what redundant memory resources are available. The repair is detailed in operations 510-515.

At operation 510, the repair begins by receiving and writing a newly identified defective memory address containing the defective memory cell at CAM 482 of FIG. 4. In conjunction with receiving and writing the defective-word address, operation 512 receives and writes the defective-bit address in RAM 483 as associated data, in a manner that ties together the locations of the defective word and the bit address. The operation occurs without interrupting an access to core memory via MAC 204-0 of FIG. 2, as the BIST is operated in the background using a separate controller, the BBC, e.g., 251-0.

At operation 513, accurate data is captured and written in RAM 483 as associated data to the defective-word address from operation 510. The accurate data is captured during testing, e.g., using EDC that can identify and correct a single-bit defect in a word. Other methods are available to capture more than single bit errors in a word, e.g., copying entire contents of a memory address before testing the memory, or by requesting a resend of a word from a host. Accurate data is also captured during a write operation, when an updated data for a word address are written. In this case, SRM 480 of FIG. 4 will match the word address for the write access and find that it matches a known defective-word address stored in CAM 482. The associated data of specific defective-bit location, stored in RAM 483, will direct WM 484 to extract the accurate data value of the appropriate bit location from the word to be written, and store that accurate bit value in RAM 483, overwriting the data value in RAM 483. Thus, a current data value for the defective bit in core memory is maintained by SRM 480.

At operation 515, the defective address is enabled for matching against new access requests from an interface. A controller in SRM 480 can toggle a valid bit in the CAM associated with the newly entered defective-word address. Operations 502 through 515 are performed in the background by BBC and by SRM 480. Thus with substitute memory repair, defective bits in core memory 125 that are weak or failed can be repaired transparently and in the background, with no interrupts and no latency hits, while the IC 102 is in service and fully operation. Alternatively, the substitute memory repair is available for production off-line repair as well.

Figure 5B:
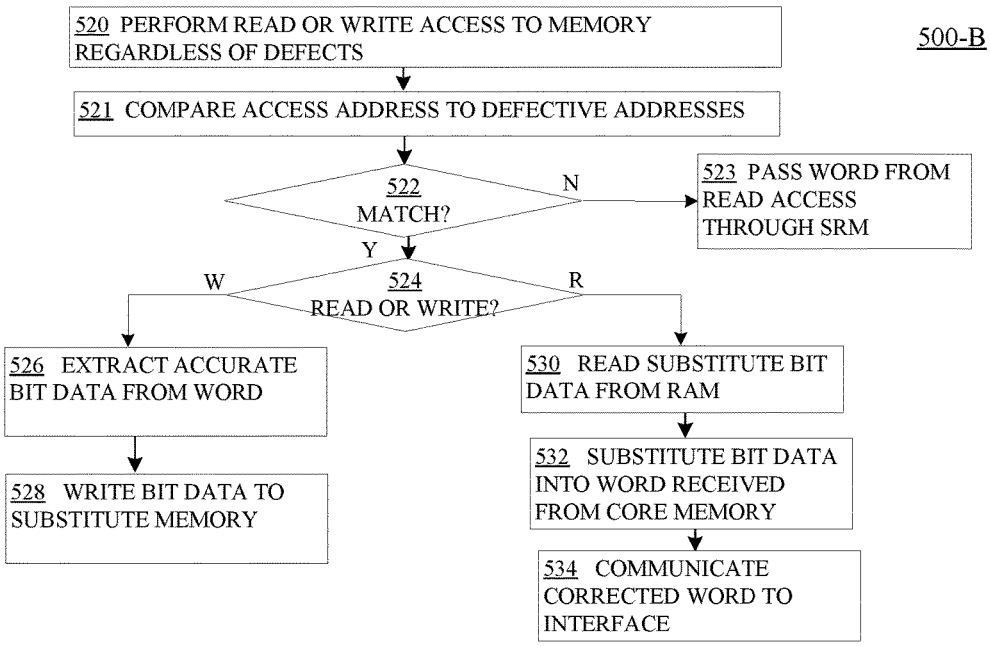

Referring now to FIG. 5B, a flowchart is shown that illustrates process 500-B for performing a bit substitution repair to data in a data path during an access to a defective memory cell, in accordance with one aspect of the present disclosure.

At operation 520, an access to core memory is performed immediately and without any conditional checks, delays, or interruptions, save a possible remap to local redundant memory, even if the address of the access is known to contain one or more defective memory cells. In this manner, latency is reduced because an inquiry is not asked upfront prior to an access execution to core memory. Rather, the inquiry and compare of the access address is done in parallel to the access to core memory. Thus, for a read access, core memory is accessed and the data to be read is output from core memory and forwarded to at least one SRM block without any interruption, even if the memory location being read has one or more defective memory cells. Similarly, for a write access, core memory is accessed and the data is written to the memory location, even if the memory location contains one or more defective memory cells. At operation 521, the address being accessed in a read or write access is received and compared to the list of known defective addresses. This occurs with every address that is accessed in core memory, including to local redundant memory.

At operation 522, an inquiry determines if the access address matches the list of known defective addresses. If the addresses do not match, then the SRM is not utilized to extract out any data from a write access, but the SRM is still utilized in operation 523 to pass any data from a read access through the bit selection circuits MR 485-0 through MR-485-n of FIG. 4, as the data is being read out of core memory to the interface. This pattern is shown in FIG. 1 with the datapaths shown between substitute memory 150 vis-à-vis memory controller 127 and core memory 125. This is because the filtering operation for replacing bits occurs on every word read from memory. If there are no defective bits in the word, then no substitution bits are needed and the MUXs MR 485-0 through MR-485-n are configured to pass the data as received from core memory through to the interface for transmission to the host. An alternative embodiment would include a bypass MUX that would bypass SRM for words that have no defective bits.

However, if an access address matches a known defective address, then operation 524 inquires whether the access is a read or write operation. This is a step that is inherently implemented in logic and architecture of SRM 480 of FIG. 4.

At operation 526, an accurate data is extracted from the word to be written and stored in the SRM at operation 528. Specifically, MUX WM 484 of FIG. 4 receives a MUX select from RAM 483 that identifies the defective bit in the core memory where the word is slated to be written. This then is the bit location in the word that needs to be saved in a bit location of a non-defective substitute memory more importantly than the defective core memory. WM 484 receives the word to be written and the MUX select extracts the appropriate data bit and WM 484 outputs the data bit to RAM 483. This operation still occurs even if the write location is to local redundant memory. This is because data written to and read from local redundant memory is transmitted in the datapath on which the SRM performs repairs, regardless of memory cell type, architecture, etc. The SRM is memory cell agnostic. Consequently it is as likely to suffer from defects as the non-redundant memory cells. Writing the accurate data to RAM 483 does not slow down the write access to core memory, or subsequent operations. By the time the SRM 480 captures the accurate data bit, it is available for a next cycle read to the memory address involved in the former write access.

If the access is a read, then at operation 530, a substitute bit data is read from RAM 483 in SRM 480 in parallel with receiving the word from core memory, so as to not increase latency.

At operation 532, the substitute bit data is substituted into the word read from core memory, as controlled by MUX select from RAM 483 to MUXs MR 485-0 through 485-n of FIG. 4. The bit address location is communicated via a decoder to MUX select lines to MR 485-0 through 485-n. The bit address location was determined by the testing operation 504 and associated with the defective-word address using CAM 482 and RAM 483. MUXs that do not receive a bit select signal for substitute bit data pass through the non-defective bits of the word as received from core memory. The output from MUXs MR 485-0 through 485-n is a corrected word having no bit defects. Consequently, the efficiency of redundant memory, i.e. RAM 483, for single bit replacement in a word is high.

At operation 534, the corrected word is communicated to an interface, or to another portion of the chip for subsequent processing. Note that additional substitute memory blocks can be concatenated with a previous substitute memory block. The procedure would repeat for a second substitute memory block to replace another bit in the word, thereby allowing 2-bit replacements per word. Alternatively, the second substitute memory block could be used as a redundancy to the first substitute memory block in case the first exhausted its RAM or CAM resources for associated data or faulty address listing, respectively. In another alternative, the second substitute memory block could replace a different granularity, such as 3 adjacent bits per word or an entire word. Note also, that the substitution operation occurs after the word is read out of core memory having a defective memory cell.

While the technology is described in some detail with specific reference to embodiments and alternatives, there is no intent to limit the technology to a particular embodiment or specific alternatives. For instance, those skilled in the art will appreciate that modifications may be made to embodiments without departing from the teachings of the present technology.

In one embodiment, the BISR module and the SRM may operate to perform in-field repairs during normal operations of the memory device. For example, a memory device may be employed to execute on enterprise networks. The enterprise network solution may require that the memory device constantly operate for a length of times measured in years. During the runtime of the enterprise network solution, a bit may fail in the memory device. The failed memory cell may then be repaired by substituting or replacing it with substitute redundant memory in a transparent manner to the system during in-field operation of the memory device.

Example Bit Replacement in Memory

Figure 6:
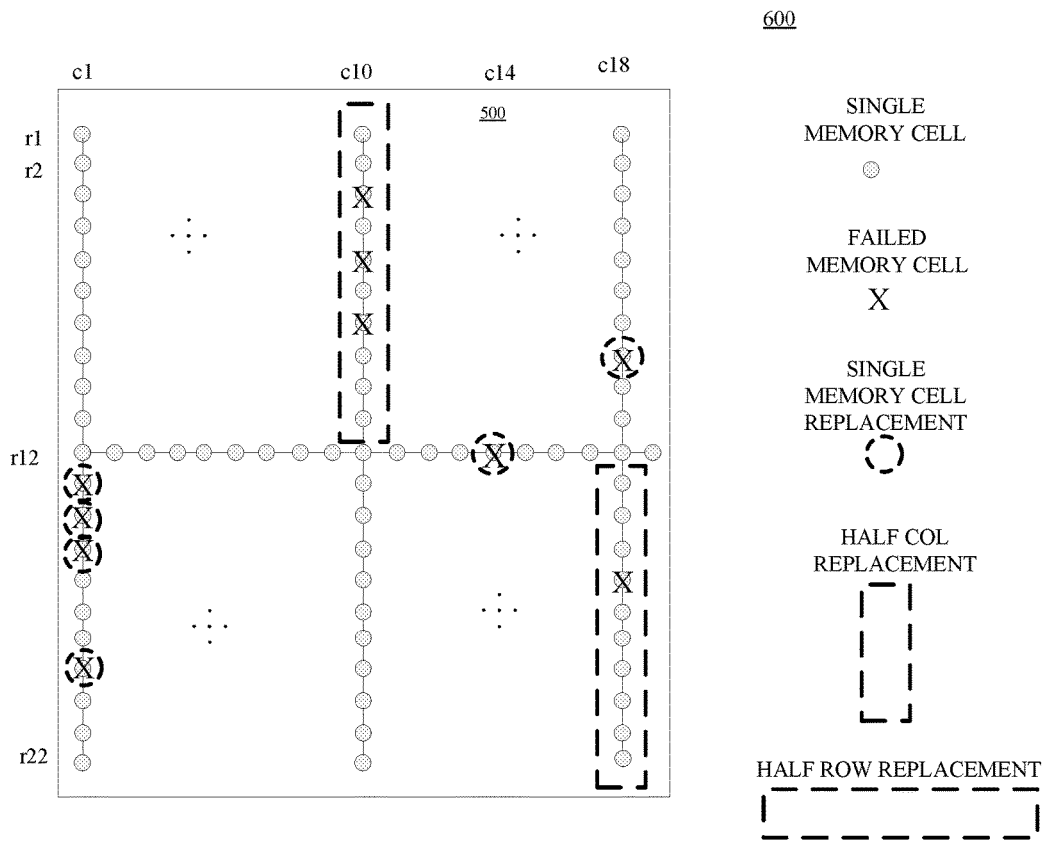
FIG. 6 is a memory block illustrating heterogeneous types of memory cell failures and heterogeneous types of memory redundancy, in accordance with embodiments of the present disclosure.

Referring now to FIG. 6, a memory block 600 is shown for illustrating heterogeneous types of memory cell failures and heterogeneous types of memory replacement, in accordance with one embodiment of the present disclosure. Failures shown in FIG. 6 are heterogeneous, ranging from a single bit errors in column c14 discovered either in production or built-in self-test in the field, to multi-bit errors per column as shown in columns c1, c10 and c18. Once discovered, a wide range of algorithms can be utilized, via either hard-wired logic, or more flexible software, or a hybrid of programmable hardware, with register settings providing the decision criteria to multiplexers that route repairs to the different forms of repair methodology, as programmed either as default in production, and as modified in the field internally to the die, based on failure trends recorded on-chip in the field, or as controlled by the host device, which has access to the programmable registers, as well as to optionally provided failure data and/or trends from the memory device.

In the example, assuming that the multi-bit failures in column c10 occurred during production, a traditional local redundant half-column memory cell replacement repair would be effectuated. Furthermore, in the field, perhaps over a number of years, subsequent weakening or failure of the balance of the bits shown would have to be addressed. With on-die built-in self-test (BIST) and built-in self-repair (BISR), the bits could be replaced, as a half-column replacement, for example, for the bottom half of column c18, assuming sufficient redundant local resources exist. Even if redundant half-column resources exist, it may be more prudent, depending on the algorithm, the history of the part, the rate of failure, and many other possible metrics, and decision points, to replace only a single bit. In that case, the single bit in the top half of column c18 using GBR version of SRM. If additional bit failures exist after the exhaustion of half-column local memory redundancy, then GBR can still be utilized, assuming sufficient GBR resources exist, to repair multi-bit failures in a given half column. While only four (4) memory cells are shown to be replaced in the bottom half of column c1, a more prudent solution may be to replace all the bits in the lower half column of c1, thus illustrating how GBR can simulate a traditional half-column replacement.

Note that the granularity of the failures can range from an isolated single bit to multiple single-bit replacement for GBR. The multi-bit replacements can address adjacent multi-bit failures or non-adjacent and separated, multi-bit failures, e.g., multi-bit failures in a given column or row. Additionally, the bit replacements can be performed by GBR in a distributed or concentrated pattern and methodology. That is, the GBR could be used more for distributed single-bit failures or low quantity multi-bit failures. Alternatively GBR repairs could be concentrated to fix a hot spot in a particular bank of memory that consumed all of its local redundant memory resources. In fact, if sufficient GBR resources were available, the GBR could repair a failure of the lowest grouping of memory, e.g., a memory bank. Furthermore, the repairs can be performed in an asymmetric or symmetric pattern and replacement methodology. For example, for symmetric pattern, the GBR could replace half-columns at a time, similar to local redundant memory. The asymmetric pattern is clear by using GBR to replace both isolated single-bit failures in a given row/column, multi-bit failures in a given row/column as well as half column replacement for either total half-column failure or partial half-column failure. The aforementioned technique provides either fixed or variable granularity for memory replacement. Different combinations and permutations of uses of GBR and/or local redundant memory can be tailored to a given application to provide a hybrid solution for a given type of failure mode on a chip-wide basis.

Multiple-Memory Assemblies, Hierarchical SRM

Figure 7:
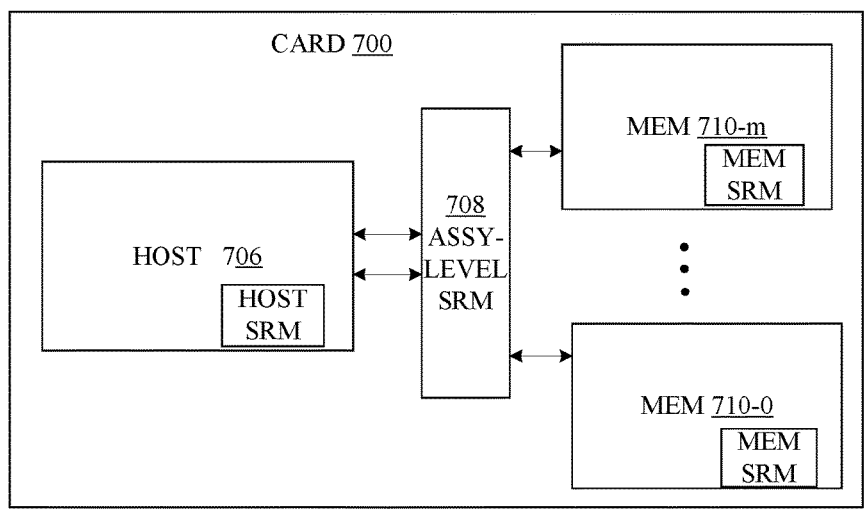
FIG. 7 illustrates a hierarchical arrangement of parallel and sequential substitute memory resources on a card, in accordance with one embodiment of the present disclosure.

Referring now to FIG. 7, a hierarchical arrangement of parallel and sequential substitute memory resources on a line card 700 is shown, in accordance with one embodiment of the disclosure. In particular, multiple memory chips MEM 710-0 through 710-$m$, where m is any quantity of chips desired on the card, coupled in parallel to an assembly level substitute memory resource 708 that is then coupled to the host 706. The host 706 has a local substitute redundant memory (SRM), as does each of the multiple memory chips 710-0 through 710-$m$. A wide variety of configurations of memory chips, processors, co-processors, intermediate function chips, etc. can be arranged in any parallel or series manner to provide a desired amount of substitute memory resources to ensure long life of the chips on the card 700, thereby reducing cost, MTBF and scrap.

Figure 8A:
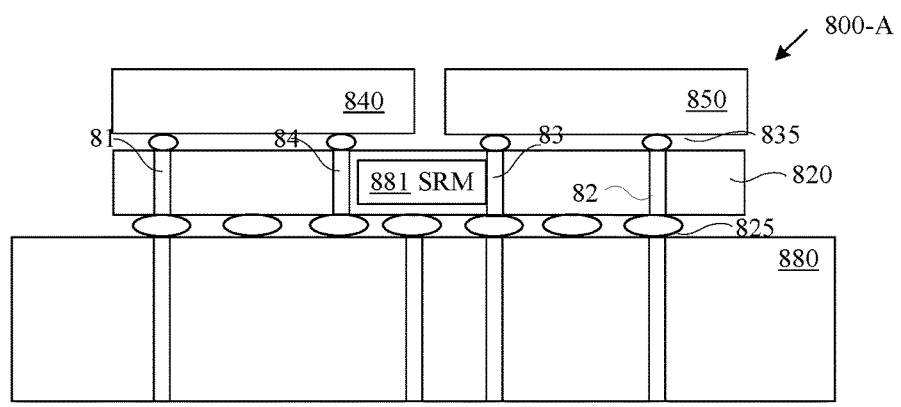
FIGS. 8A, B illustrate a cross section of a stacked die assembly in accordance with one embodiment of the present disclosure.
Figure 8B:
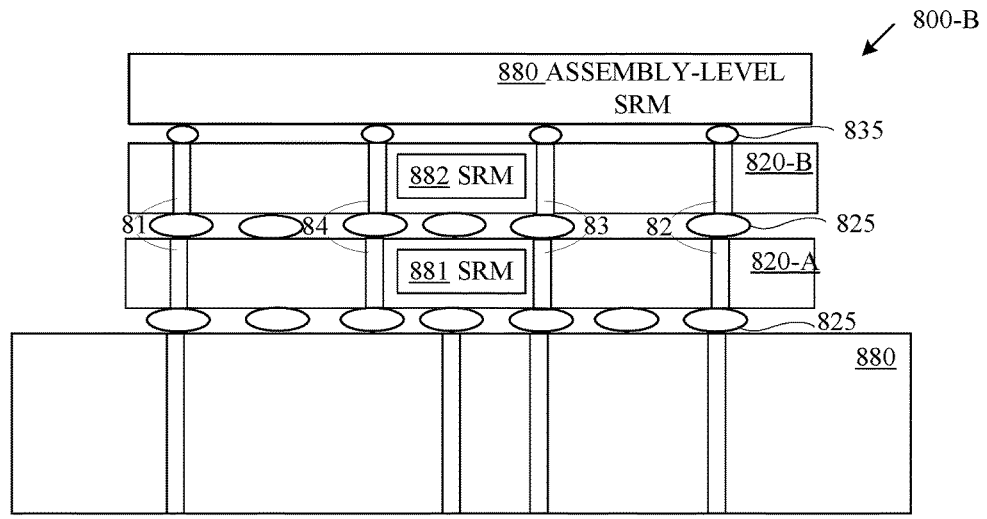

Referring now to FIGS. 8A-B, one example is shown of a three-dimensional (3D) assembly of multiple memory chip modules, or assemblies, e.g., 2 or more, all of which can be served by a respective on-die SRM blocks 881 and/or 882 for chips 800-A, 800-B, or can be served by a single assembly-level SRM block serving all of the multiple chips, or by a combination of the two: a local SRM block on each chip, plus an assembly-level SRM 880 to catch any failures that could not be repaired on a given memory chip. In one embodiment, the SRMs are configured as a GBR. The stacked chips can be coupled by wires, such as wire bonding, or by vias such as through-silicon vias (TSVs). Given the ever-increasing size of packaged memory providing SRM can effectively improve yield, particularly in areas where concentrated high-failure rates exceed local redundant memory. The hierarchy of SRM as shown in FIG. 8B can be similarly utilized for 2D or 2.5D memory. In the case of hierarchical SRM, the increasingly higher level SRM would communicate with the lower level SRMs to monitor when their resources have been consumed, with a corresponding address scheme that would uniquely identify the lower level chip from a higher level chip, and unique memory address of the failed memory cell therein. The multiple memory assemblies can be encapsulated into a multi-chip module (MCM) or as multiple chips on an interposer, or on a printed circuit board, or specifically on a line card.

Package 800-A is shown as including a memory device 820, which may be an ASIC or a memory device with embedded processing capabilities, is coupled to substrate 880 through balls 825. An adhesive is applied to second and third dies 840 and 850 respectively to mount the dies to memory device 820. In a less preferred embodiment, dies 840 and 850 may be wire-bonded to memory device 820. Wire bonding is a less preferred way of connecting the stack because it will increase the propagation delay of the signals. Both dies 840 and 850 are coupled to memory device 820 through bumps 835, while memory device 820 is coupled to substrate 880 through conducting balls 825. Vias 81-84 in device 820 allow IC 820 to communicate with dies 840 and 850. Vias 81-84, e.g., TSVs, that communicate through chips stacked in a veridical direction, perpendicular to the face of the chip. The stack of chips can be homogeneous, such as stacked commodity or specialty memory, or can be heterogeneous as described above, with memory stacked with one or more different types of processor. Similarly, substrate 880 is provided with conducting balls (not shown) that attach to a PCB. Dies 840 and 850 may contain an ASIC, FPGA, CPU memory, or logic. Alternatively, dies 840 and 850 may have identical functions that provide memory device 820 with a new feature or an expanded memory capacity.

Furthermore, while the failure modes described have been discussed as half-column redundancy, the present disclosure is well-suited to a wide range of local memory redundancy, such as whole column replacements, and half-row and whole-row replacements, or combinations thereof. Additionally, while the embodiments described have focused on chips classified primarily as memory chips, whether commodity or smart specialized memory, the present disclosure is well-suited to on-die memory, and hard and soft IP memory core applications on other functional chips such as an ASIC, a field programmable gate arrays (FPGAs), programmable logic devices (PLDs), microprocessors, microcontrollers, graphics processors, co-processors, etc. While the embodiments described herein have provided specific examples, the present disclosures is well-suited to a wide range of combinations and permutations of the provided architecture, procedure, methodology, coupling arrangements, hierarchy, etc.

Unless specifically stated otherwise as apparent from the foregoing discussions, it is appreciated that throughout the present description of embodiments, discussions utilizing terms such as "detecting," "executing," "replacing," or the like, refer to the actions and processes of a memory device, a computer system, or similar electronic computing device. The memory device or similar electronic computing device manipulates and transforms data represented as physical (electronic) quantities within the devices' registers and memories into other data similarly represented as physical quantities within the devices' memories or registers or other such information storage, transmission, or display devices.

Although the subject matter is described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. An integrated circuit (IC) chip comprising:
   an interface for receiving data and address information;
   a memory comprising a plurality of memory cells;
   a substitute memory comprising a plurality of substitute memory cells;
   address matching circuitry for comparing a memory address of an incoming access against known memory addresses with at least one defective memory cell; and
   data selection circuitry for selectively outputting at least one substitute data bit in the data read from the known memory addresses with at least one defective memory cell; and wherein:
      the data selection circuitry is coupled to the address matching circuitry, the substitute memory and the memory;
      the substitute memory is a global substitute memory block accessible to repair any memory cell in the memory; and
      the memory is a core memory having a plurality of memory cells including non-redundant memory cells and redundant memory cells.

2. The IC chip of claim 1 wherein:
   the address matching circuitry is configured to store the newly identified memory address without interrupting an access occurring at the same time as the operation to store the newly identified memory address.

3. The IC chip of claim 1 further comprising:
   means for repairing an address of a defective memory cell located in the memory at the same time as accessing another address in the memory in a manner that is transparent to a host device that is accessing the another address.

4. The IC chip of claim 1 wherein:
   the data selection circuitry is disposed in a datapath of every word that is read from memory.

5. The IC chip of claim 1 wherein:
   the data selection circuitry includes a plurality of bit-selection circuits;
   a word that is accessed from the memory includes a plurality of bits;
   the quantity of the plurality of bit-selection circuits equals the quantity of the plurality of bits in the word; and
   the data selection circuitry is configured to substitute one or more substitute bits accessed from the substitute memory for a respective one or more defective data bits in a word accessed from the memory.

6. The IC chip of claim 5 wherein:
   each of the bit-selection circuits is coupled to the memory, to receive a respective data bit from a word in memory, and is coupled in parallel to the substitute memory to receive a respective substitute bit for a defective data bit received from the memory.

7. The IC chip of claim 5 wherein:
   any quantity of the bit-selection circuits in the data selection circuitry can be configured to substitute in a substitute bit, accessed from the substitute memory, for a respective defective data bit in a word accessed from the memory.

8. The IC chip of claim 7 wherein:
   the data selection circuitry is configured to substitute in substitute bits only for defective data bits in a word accessed from the memory, up to a maximum of the length of the word.

9. The IC chip of claim 1 wherein:
   the substitute memory is disposed apart from the memory array of memory cells.

10. The IC chip of claim 1 wherein:
    the substitute memory has a cell construction that is different than a cell construction of the memory.

11. The IC chip of claim 1 wherein:
    the substitute memory has an architecture that is different than an architecture of the memory.

12. The IC chip of claim 11 wherein:
    the architecture of the substitute memory is configured to replace one or more defective memory cells located anywhere in a word.

13. The IC chip of claim 11 wherein:
    the architecture of the substitute memory is configured to repair defective memory cells during production-level testing or during in-service operation.

14. The IC chip of claim 1 wherein:
    the memory is a RAM cell type of memory cell; and
    the architecture of the substitute memory comprises both a RAM type memory cell, for storing associative data, and a CAM type memory cell, for storing addresses of the memory having known defects, coupled to each other.

15. The IC chip of claim 1 further comprising:
    a plurality of repair memory architecture types including:
       a local redundant memory having a first architecture type; and
       the substitute memory having a second architecture type; and wherein:
          the substitute memory is coupled to the local redundant memory;
          each of the plurality of different repair memory architecture types is configured to repair a defective memory cell in the IC chip; and
          the first architecture type is different from the second architecture type.

16. The IC chip of claim 15 wherein:
    the memory contains a plurality of memory banks, each having a plurality of memory cells from the memory coupled to each other;
    each of the memory banks includes a local redundant memory including a plurality of redundant memory cells that are only available for repairing defective memory cells in the memory bank containing the local redundant memory; and
    the substitute memory is available for repairing or substituting defective memory cells in the plurality of memory banks.

17. The IC chip of claim 16 further comprising:
    a first multiplexer coupled to at least one of the plurality of memory banks and to the local redundant memory; wherein:

the first multiplexer is configured to selectively output either a first data input received from the memory or a second data input received from the local redundant memory; and a second multiplexer coupled to the first multiplexer and the substitute redundant memory; wherein:
the second multiplexer is configured to selectively output either a first data input received from the first multiplexer or a second data input received from the substitute memory.

18. The IC chip of claim 15 wherein:
the first type of repair memory architecture is disposed within an array of memory cells in the memory; and
the second type of repair memory architecture is disposed apart from an array of memory cells in the memory.

19. The IC chip of claim 15 wherein:
the first type of repair memory architecture has a cell construction that is the same as a cell construction of the memory; and
the second type of repair memory architecture has a cell construction that is different than the cell construction of the memory.

20. The IC chip of claim 15 wherein:
the first type of repair memory architecture has an architecture that is the same as an architecture of the memory; and
the second type of repair memory architecture has an architecture that is different than the architecture of the memory.

21. The IC chip of claim 15 wherein:
the first type of repair memory architecture comprises a group of memory cells addressable only as a group; and
the second type of repair memory architecture comprises a group of memory cells addressable as individual memory cells.

22. The IC chip of claim 15 wherein:
the first type of repair memory architecture requires an interrupt to a host accessing the IC when a repair is implemented for an address having a defective memory cell; and
the second type of repair memory architecture does not require an interrupt to a host accessing the IC when a repair is implemented for an address having a defective memory cell.

23. The IC chip of claim 15 wherein:
the first type of repair memory architecture can be configured for a repair only during production-level testing for a defective memory cell; and
the second type of repair memory architecture can be configured for a repair both during production-level testing and during in-service operation.

24. The IC chip of claim 15 wherein:
the first type of repair memory architecture comprises only a RAM type memory cell; and
the second type of repair memory architecture comprises a hybrid combination of a RAM type memory cell and a CAM type memory cell coupled to each other.

25. The IC chip of claim 15 wherein:
the first type of repair memory architecture can only be configured to repair a defective memory cell in the memory; and
the second type of repair memory architecture can be configured to repair a defective memory cell communicating on a datapath having substitute memory.

26. The IC chip of claim 15 further comprising:
a plurality of memory partitions of the memory, each partition including a plurality of specific memory banks arrayed together in its respective partition; and
a plurality of substitute memory blocks intermediately disposed on a datapath between the local redundant memory and the interface, wherein each of the substitute memory blocks is accessible to one or more specific memory partitions, but not to all the memory partitions.

27. The IC chip of claim 26 wherein:
an additional instance of a substitute memory is accessible only to memory cells disposed within a single memory partition.

28. The IC chip of claim 26 wherein:
a defective memory cell can be replaced by one of a plurality of substitute memory blocks;
one of the plurality of substitute memory blocks is accessible to a first group of memory banks;
another of the plurality of substitute memory blocks is accessible to a second group of memory banks; and
the first group of memory banks does not overlap the second group of memory banks.

29. The IC chip of claim 28 wherein:
a first substitute memory block is configured to selectively replace a defective memory bit in a word received from the memory, including the local redundant memory; and
a second substitute memory block is configured to selectively replace a defective memory bit in a word received from the first substitute memory block or from the memory, including the local redundant memory.

30. The IC chip of claim 26 wherein the plurality of repair memory is selected from a group of memory types comprising:
the local redundant memory;
a first substitute memory block disposed at an intermediate level and available to only a portion of the memory cells in the memory, including the local redundant memory; and
a second substitute memory block disposed at a global level and available to all memory cells in the memory, including the local redundant memory.

31. The IC chip of claim 26 wherein the substitute memory is divided into a plurality of substitute memory blocks that are each separately coupled to one or more memory partitions.

32. The IC chip of claim 31 wherein at least one of the plurality of substitute memory blocks is coupled to a plurality of memory partitions.

33. The IC chip of claim 31 wherein:
each of the substitute memory blocks are arranged hierarchically in a plurality of levels; and
each of the plurality of levels includes a larger grouping of memory cells in the memory.

34. The IC chip of claim 31 wherein one or more of the plurality of levels of redundant memory blocks have a different granularity of how many defective data bits can be replaced.

35. The IC chip of claim 1 further comprising:
one or more input lines on the IC for receiving data, control, and address information; and wherein:
the substitute memory includes one or more substitute memory blocks, each containing a decoder;
the memory includes one or more decoders;
the one or more input lines are coupled to both the one or more decoders in the memory and a decoder in each of the substitute memory blocks in order to share the data, address and control information.

36. The IC chip of claim 1 wherein the substitute memory includes a comparator memory coupled to an associative memory.

37. The IC chip of claim 36 wherein:
the comparator memory is a content addressable memory (CAM);
the CAM is configured to store an address to at least one defective memory cell in the memory; and
the associative memory contains at least one respective substitute bit to be substituted in for the at least one defective memory cell.

38. The IC chip of claim 36 wherein:
the associative memory, which associates accurate bit data and bit address with a defective-word address in the memory, outputs a select signal to configure a multiplexer to substitute replacement data from the substitute memory for the defective data in the word.

39. The IC chip of claim 1 further comprising:
a built-in self-repair (BISR) module for repairing one or more defective memory cell in the memory; and
a plurality of repair memory types including:
a local redundant memory that replaces the addressable length of a word of memory cells slated for access in the memory, with a same quantity of memory cells in the local redundant memory, wherein the accessed word has one or more defective memory cells and the quantity of local redundant memory cells has no defective memory cells; and
the substitute memory containing fewer memory cells than the addressable length of the word of memory cells slated for access in the memory, wherein the substitute bits from the substitute memory are substituted for the defective bits in the word accessed from the memory while in a data path between the memory and the interface of the IC chip.

40. The IC chip of claim 39 wherein:
the BISR module is configured to repair the one or more defective memory cells based upon any combination of the following parameters: a quantity of local redundant memory available, a quantity of shared redundant memory available, a type of failure mode of the one or more defective memory cells, and an amount of time the IC has been in service.

41. The IC chip of claim 39 wherein:
the BISR module comprises a built-in self-test (BIST) to identify the defective memory cells in the memory, including the local redundant memory.

42. The IC chip of claim 39 wherein the operation of detecting a defective bit is accomplished using a fixed test pattern to test a plurality of memory bits.

43. The IC chip of claim 42 wherein:
the operation of detecting the failed bit is accomplished in service operation of the IC chip or during a production phase of the IC chip.

44. The IC chip of claim 1 wherein:
the substitute memory stores address information indicating discrete locations of the one or more defective memory cells within a word.

45. The IC of claim 1 wherein:
the address matching circuitry is configured to store a newly identified memory address having at least one defective memory cell while the IC chip is in-service.

46. An IC chip comprising:
an interface for receiving data and address information;
a memory comprising a plurality of memory cells;
a substitute memory comprising a plurality of substitute memory cells;
address matching circuitry for comparing a memory address of an incoming access against known memory addresses with at least one defective memory cell; and
data selection circuitry for selectively outputting at least one substitute data bit in the data read from the known memory addresses with at least one defective memory cell; and wherein:
the data selection circuitry is coupled to the address matching circuitry, the substitute memory and the memory;
the substitute memory has an architecture that is different than an architecture of the memory;
the architecture of the substitute memory comprises a memory type that has a first reliability rating;
the memory comprises a memory type that has a second reliability rating; and
the second reliability rating is greater than the first reliability rating.

47. In an integrated circuit (IC) chip having a memory, a method of repairing defective memory cells, the method comprising:
receiving data and address information at an interface for accessing the memory, comprising a plurality of memory cells;
comparing, at address matching circuitry, a memory address of an incoming access against known memory addresses with at least one defective memory cell;
receiving at a substitute memory block, a defective-word address having one or more defective memory cells in the memory;
writing the defective-word address into a comparing circuitry portion of the substitute memory block for comparing against future access addresses;
capturing accurate data associated with the at least one defective memory cell;
writing the accurate data in the substitute memory block in a manner that associates the accurate data with the defective-word address; and
selectively outputting, at data selection circuitry, at least one substitute data bit in data read from the known memory addresses with at least one defective memory cell; and wherein:
the operation of writing the defective-word address is performed while the IC chip is in service;
the substitute memory block is a global substitute memory block accessible to repair any memory cell in the memory; and
the memory is a core memory having a plurality of memory cells including non-redundant memory cells and redundant memory cells.

48. The method of claim 47 further comprising:
performing a requested read or write access to a specified address in memory regardless of whether the address is known to have a defective memory cell.

49. The method of claim 47 wherein:
the memory is a core memory that includes an array of non-redundant memory cells and an array of redundant memory cells;
the substitute memory block is disposed apart from the core memory; and
the comparing circuitry is a content addressable memory (CAM) for storing the defective-word address containing one or more defective memory cells.

50. The method of claim 47 wherein:
an access operation for a given word address is performed by the IC chip without interruption while the operation of receiving and storing the defective-word address occurs.

51. The method of claim 47 wherein:
the operation of writing the defective-word address is transparent to a user requesting the access of the given word address.

52. The method of claim 47 further comprising:
enabling a memory portion of the substitute memory block that stored the defective-word address to compare addresses of subsequent accesses to memory against the second word address; and wherein
the enabling operation occurs without any interruption to an ongoing access to the memory.

53. The method of claim 47 further comprising:
testing memory cells disposed in the memory to identify one or more defective memory cells therein; and wherein:
the memory cells tested include local redundant memory.

54. The method of claim 53 further comprising:
receiving a bit-address that identities at least one defective-bit location in the defective-word address that corresponds to the at least one defective memory cell in the memory; and
writing the bit-address into a RAM portion of the substitute memory block that associates the bit-address with the defective-word address.

55. The method of claim 47 further comprising:
receiving the defective-word address from a built in self-test (BIST) module disposed within the IC chip during production testing of the IC or during in-service IC operation.

56. The method of claim 47 further comprising:
receiving the defective-word address from a host user, external to the IC, during in-service IC operation.

57. The method of claim 47 further comprising:
receiving one or more corrected bit values corresponding to the at least one defective bit location identified in the word.

58. The method of claim 47 further comprising:
receiving data and a corresponding write access command that is directed to a given word address in memory; and
writing the data corresponding to the given word address into memory regardless of whether the given word address points to defective or non-defective memory.

59. The method of claim 58 further comprising:
comparing the given word address to a list of word addresses having one or more known defective memory cells using comparator circuitry; and
writing into a RAM portion of the substitute memory block, if the given word address matches one of the word address in the list, accurate data from the write access command that corresponds to one or more defective memory cells in memory at the given word address; and wherein:
the substitute memory block associates the accurate data with the given address for the benefit of future read accesses to the given address.

60. The method of claim 59 wherein:
the comparing operation and the writing into the RAM portion of the substitute memory block operation are performed in parallel with the operation of writing to the memory.

61. The method of claim 60 further comprising:
reading substitute bits from the substitute memory in parallel with the operation of reading data from the given word address in memory.

62. The method of claim 58 wherein:
the writing operation into the memory and the comparing operations are still performed even if the given word address points to local redundant memory in the memory.

63. The method of claim 47 further comprising:
receiving a read access command to a given word address in memory; and
reading data from the given word address in memory regardless of whether the given word address has a known defective memory cell or not.

64. The method of claim 63 wherein:
the substituting operation occurs after the data is output of from the memory.

65. The method of claim 63 further comprising:
comparing the given word address against a list of known defective-word addresses using the comparing circuitry; and wherein:
performing the following operations if the given word address matches a word address in the list of word addresses:
reading from the substitute memory block, one or more bit addresses and one or more respective replacement bit data, both of which correspond to a position of the one or more defective bits in a word stored at the given word address;
decoding at a decoder the respective one or more bit addresses to generate and communicate one or more respective select signals to one or more respective selective bit circuits that correspond to the position of the one or more defective bits in a word read from the given word address;
communicating the one or more substitute bits from the substitute memory to the one or more respective selective bit circuits corresponding to the position of the one or more defective bits in the word read from the given word address;
substituting the respective one or more substitute bits for the respective one or more defective bits in the word; and
outputting a corrected word from the substitute memory block to the interface of the IC chip.

66. The method of claim 47 further comprising:
substituting one or more substitute bits only for a respective one or more defective bits in a word read from the defective-word address having one or more defective memory cells;
leaving non-defective bits in place in the word as received from memory; and
communicating a corrected word containing the substitute bits and the non-defective bits to an interface.

67. The method of claim 47 wherein:
the operations of writing the defective word address and capturing accurate data is performed on at least one of a plurality of substitute memory blocks disposed on a datapath between the memory and an interface.

68. The method of claim 67 wherein:
each of the plurality of substitute memory blocks for a given level of substitute memory is uniquely associated with a plurality of memory banks each having a plurality of memory cells.

69. The method of claim 67 further comprising:
associating at least one additional substitute block with one or more memory banks that is already associated with one or more of the plurality of substitute memory blocks.

70. The method of claim 69 further comprising:
repairing a defective memory cell in the memory using a built in self-repair (BISR) module, the repairing operation chosen from a group of repairs consisting:
  replacing both defective memory cells and non-defective memory cells for a memory address having at least one defective cell by rerouting an access to the memory address to an address in a local redundant memory; and
  substituting one or more non-defective bits in the substitute memory block for the defective bit of the word, while the word is in a data path between the memory and an interface of the IC.

71. The method of claim 67 further comprising:
communicating a word for a write access or a word for a read access through a bit selection circuit of at least one substitute memory block regardless of whether the word for the write access or the word for the read access has a defective bit.

72. The method of claim 47 further comprising:
communicating a word from a read access through a bit selection circuit in each of two or more substitute memory blocks; and wherein:
  the two or more substitute memory blocks are disposed in series with each other on a datapath between the memory and an interface.

73. The method of claim 72 further comprising:
replacing a defective memory bit with a replacement bit in a bit selection circuit of only one of the two or more substitute memory blocks.

74. The method of claim 72 wherein:
any substitute memory block can replace any defective memory bit arising on the datapath between the memory and the interface.

75. The method of claim 47 further comprising:
configuring a first substitute memory to replace a first desired defective memory bit in a word received from the memory or the local redundant memory;
configuring a second substitute memory block to replace a second desired defective memory bit in a word received from the first substitute memory, the memory or the local redundant memory; and wherein:
  the first substitute memory block is disposed on a datapath between the memory, including local redundant memory, and the second substitute redundant memory block; and
  the second substitute memory block is disposed on a datapath between the first substitute memory and an interface.

76. The method of claim 47 further comprising:
selecting a substitute bit for a defective memory bit, the substitute bit chosen from a group of redundant resources comprising:
  local redundant memory;
  a first shared redundant memory that is an intermediate level available to only a portion of the memory cells in the memory, including local redundant memory; and
  a second shared redundant memory that is globally available to all memory cells on the IC.

* * * * *